(12) United States Patent
Sutono

(10) Patent No.: US 11,395,402 B2
(45) Date of Patent: *Jul. 19, 2022

(54) HIGH-DENSITY DUAL-EMBEDDED MICROSTRIP INTERCONNECTS

(71) Applicant: Intel Corporation, Santa Clara, CA (US)

(72) Inventor: Albert Sutono, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 756 days.

This patent is subject to a terminal disclaimer.

(21) Appl. No.: 16/170,474

(22) Filed: Oct. 25, 2018

(65) Prior Publication Data

US 2019/0069391 A1   Feb. 28, 2019

(51) Int. Cl.

| H05K 7/00 | (2006.01) |
|---|---|
| H05K 1/02 | (2006.01) |
| H01L 23/538 | (2006.01) |
| H01L 23/528 | (2006.01) |
| H01P 3/08 | (2006.01) |
| H05K 1/18 | (2006.01) |
| H01L 25/065 | (2006.01) |
| H01L 23/66 | (2006.01) |

(52) U.S. Cl.
CPC ......... *H05K 1/0216* (2013.01); *H01L 23/528* (2013.01); *H01L 23/5386* (2013.01); *H01L 23/66* (2013.01); *H01L 25/065* (2013.01); *H01P 3/081* (2013.01); *H05K 1/181* (2013.01); *H01L 2223/6627* (2013.01); *H01L 2223/6638* (2013.01); *H01L 2224/16227* (2013.01); *H01L 2924/15192* (2013.01); *H01L 2924/19104* (2013.01); *H05K 2201/10159* (2013.01); *H05K 2201/10325* (2013.01); *H05K 2201/10545* (2013.01)

(58) Field of Classification Search
CPC ...... H05K 1/0216; H05K 1/181; H05K 1/081; H01L 23/528; H01L 23/5386; H01L 23/66; H01L 25/065
USPC ........................................................ 361/782
See application file for complete search history.

(56) References Cited

U.S. PATENT DOCUMENTS

2019/0080999 A1 *   3/2019   Eom ................. H01L 23/49822

FOREIGN PATENT DOCUMENTS

CN          102301435       * 12/2014

* cited by examiner

*Primary Examiner* — Andargie M Aychillhum
(74) *Attorney, Agent, or Firm* — Schwabe, Williamson & Wyatt, P.C.

(57) ABSTRACT

In accordance with embodiments disclosed herein, there is provided a high-density dual-embedded-microstrip interconnect. An interconnect includes a reference layer and a dielectric disposed on the reference layer. The interconnect further includes a pair of conductors including a first conductor and a second conductor that are in an edge-facing orientation. The interconnect further includes a third conductor. The pair of conductors may be disposed within the dielectric and the third conductor may be disposed on the dielectric above the pair of conductors. The pair of conductors may be disposed on the dielectric and the third conductor may be disposed within the dielectric below the pair of conductors. First noise received by the third conductor from the first conductor and second noise received by the third conductor from the second conductor at least partially cancel out.

20 Claims, 9 Drawing Sheets

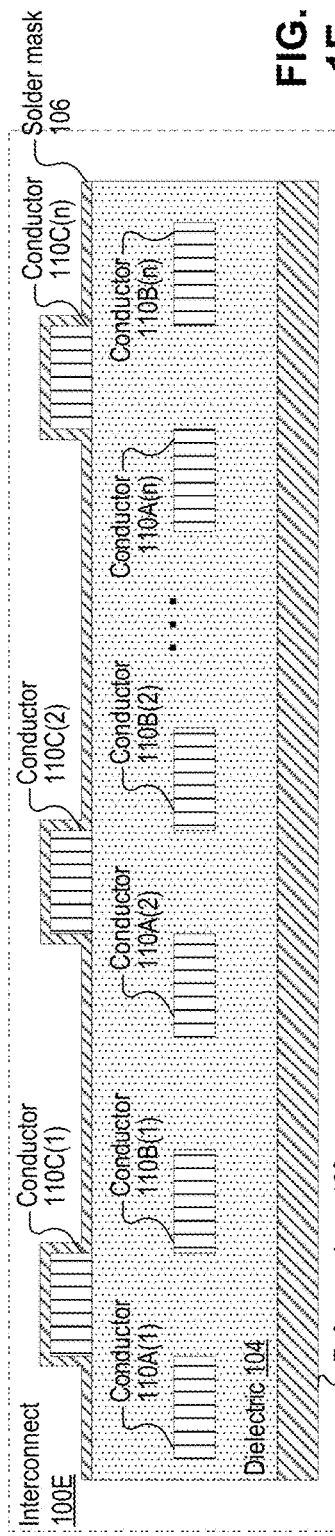
FIG. 1E
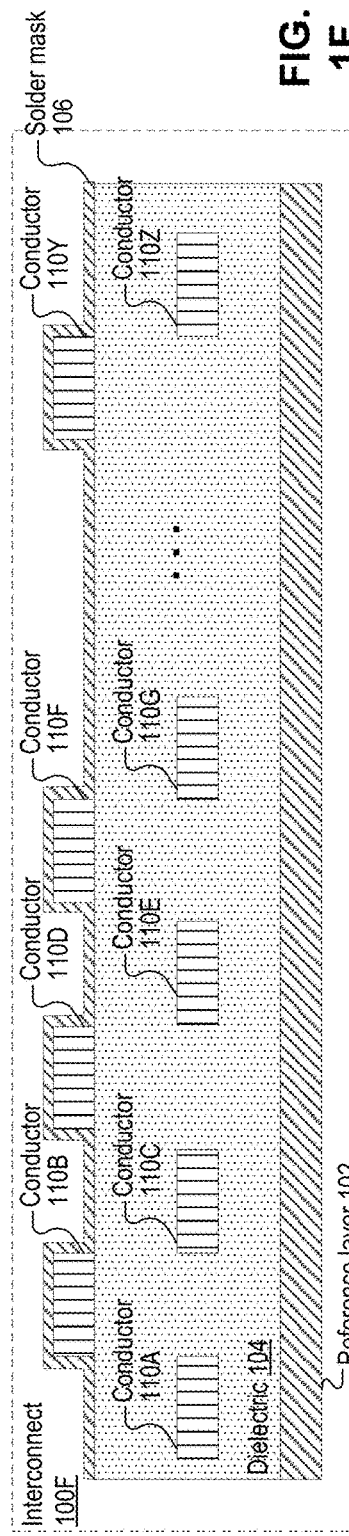
FIG. 1F
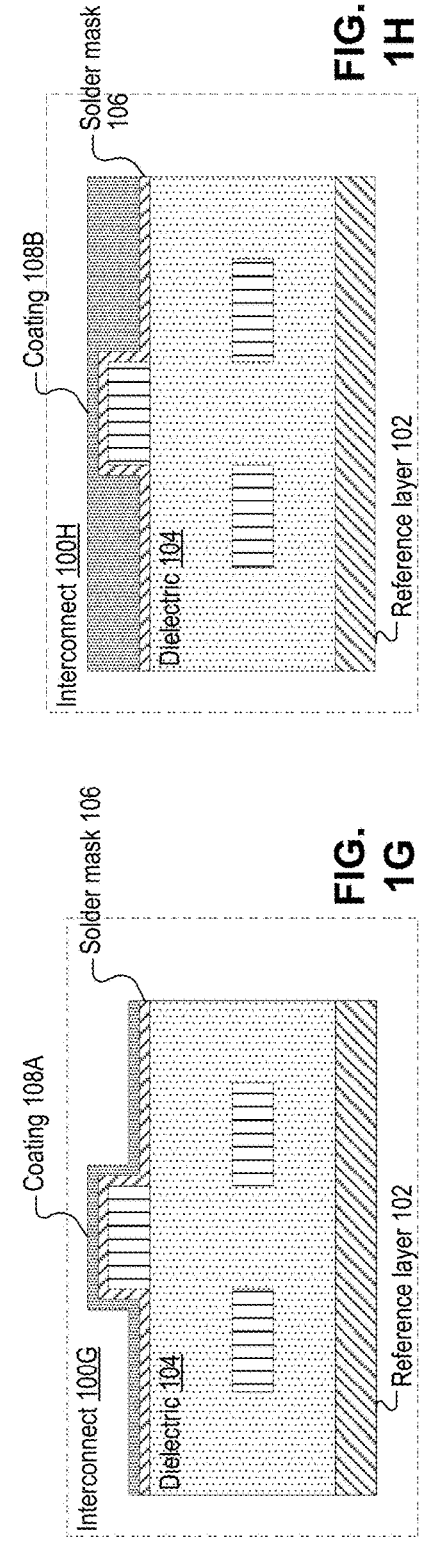
FIG. 1G
FIG. 1H

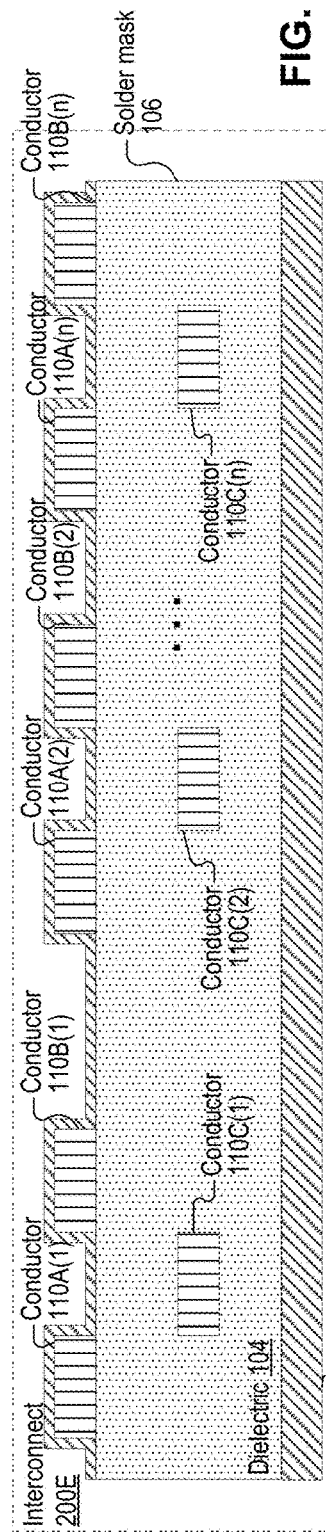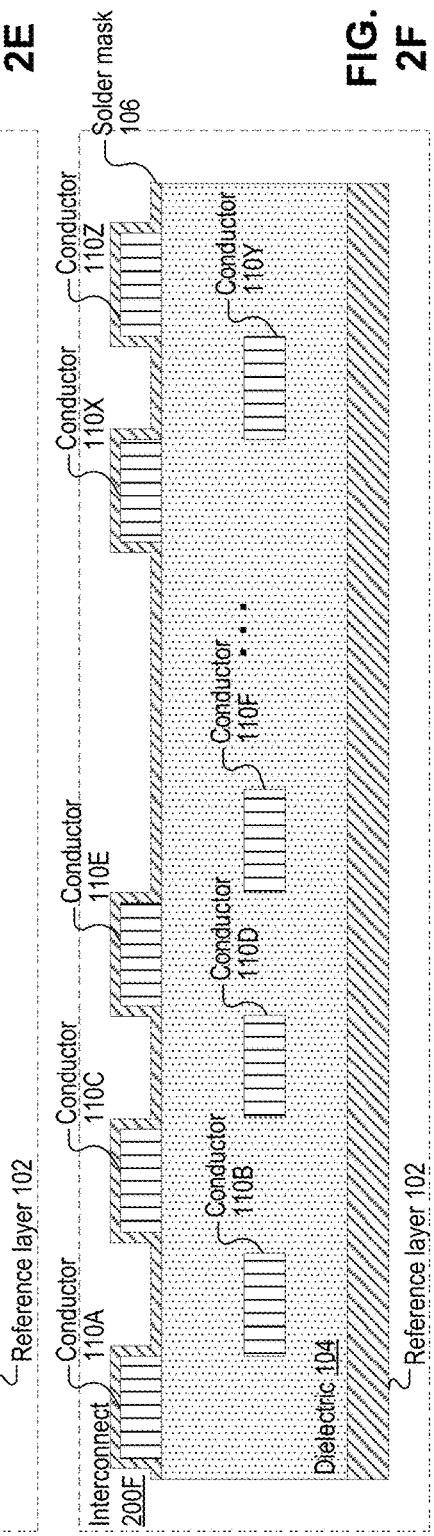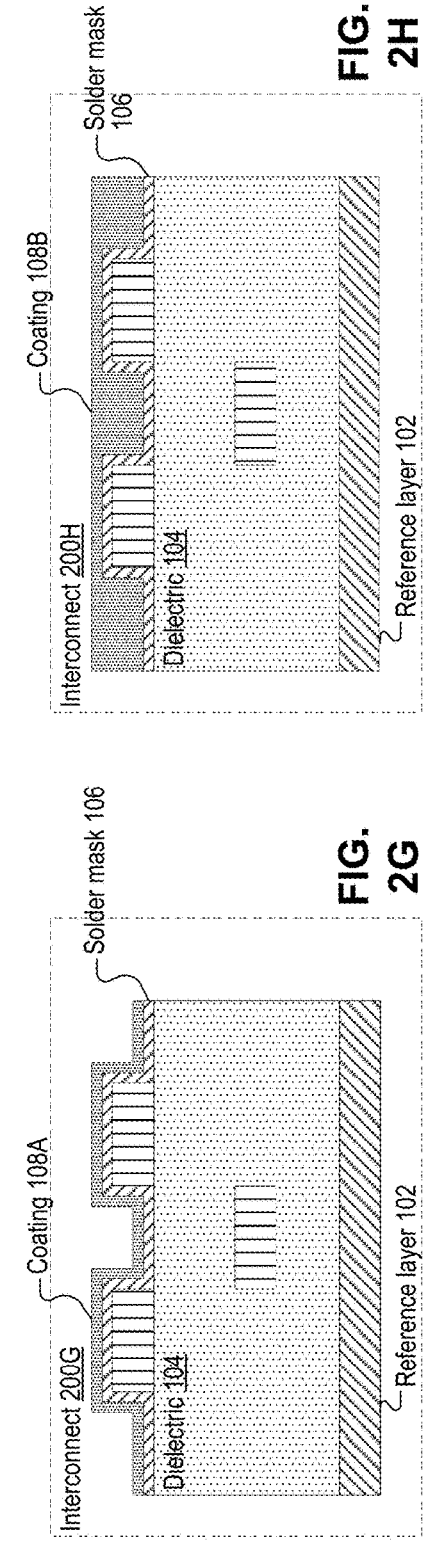

HIGH-DENSITY DUAL-EMBEDDED MICROSTRIP INTERCONNECTS

FIGS. 1A-H illustrate cross-sectional views of interconnects that include a reference layer, a dielectric disposed on the reference layer, a pair of conductors disposed within the dielectric, and a conductor disposed on the dielectric above the pair of conductors, according to certain embodiments.

FIGS. 2A-H illustrate cross-sectional views of interconnects that include a reference layer, a dielectric disposed on the reference layer, a conductor disposed within the dielectric, and a pair of conductors disposed on the dielectric above the conductor, according to certain embodiments.

FIGS. 3A-C are graphs that illustrate far end crosstalk (FEXT), according to certain embodiments.

DESCRIPTION OF EMBODIMENTS

Figure 1A:
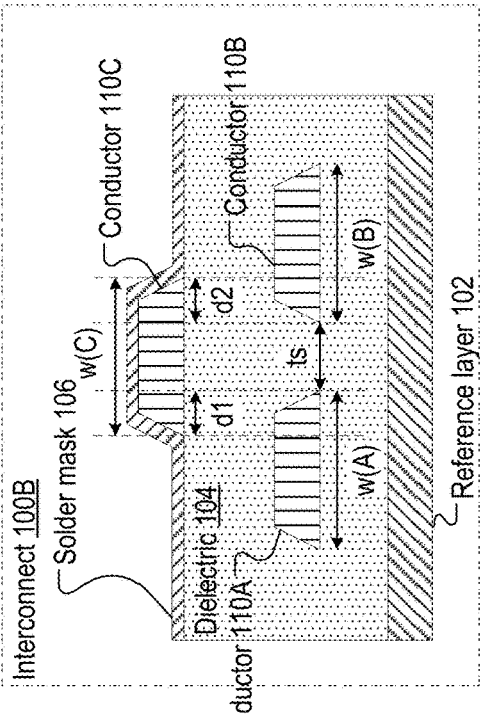

Described herein are technologies directed to high-density dual-embedded microstrip interconnects. Conductors (e.g., microstrips) may be routed on an upper layer or a lower layer of a system. The system may be a printed circuit board (PCB), embedded multi-die interconnect bridge (EMIB), integrated circuit die, integrated circuit package, semiconductor package, etc. The conductors may connect components of the system. A first side of conductors may be covered by a solder mask and a second side of the conductors may be separated from a reference layer by a dielectric.

Crosstalk may occur between conductors that are routed proximate each other. Crosstalk may be a result of electric and magnetic fields between conductors. When a signal is driven onto a conductor, an electromagnetic wave is induced that carries the information from the driver (e.g., transmitter) to the receiver. When other signals are routed in the vicinity of driving signal, the electric and magnetic fields intersect the adjacent (e.g., victim) conductors and induce crosstalk noise in the form of voltages and currents. The increased crosstalk noise degrades signal integrity and leads to functional problems on the conductors that can reduce system performance (e.g., low or failing electrical margins leading to bit errors, broken communication links, and other functional failures). In one example, high-speed conductor routing (e.g., double data-rate (DDR), Ethernet, etc.) at a decreased conductor-to-conductor separation may have higher crosstalk behavior as a result of stronger electromagnetic field coupling that contributes to crosstalk. To reduce crosstalk, conductors may be offset which results in a larger area (e.g., larger circuit board area) and decreases routing density. As form factors in the computing industry decrease, components are placed closer and closer together and systems become smaller which increases routing density and may increase crosstalk.

The devices, systems, and methods, as disclosed herein, provide an interconnect in a high-density, dual-embedded microstrip (DEM) configuration. The interconnect (e.g., DEM interconnect, DEM conductor system) may include a reference layer and a dielectric disposed on the reference layer. In some embodiments, the interconnect may further include a pair of conductors including a first conductor and a second conductor that are in an edge-facing orientation within the dielectric above the reference layer and a third conductor disposed on the dielectric above the pair of conductors and the reference layer. In some embodiments, the interconnect may further include a pair of conductors including a first conductor and a second conductor that are in an edge-facing orientation on the dielectric and a third conductor disposed within the dielectric below the first conductor and the second conductor. By having a third conductor disposed above or below a pair of conductors, crosstalk cancelation may occur. Crosstalk cancellation may allow the pair of conductors to be disposed closer to each other in the DEM configuration than in a single-layer configuration. The DEM configuration also allows for a higher routing density than single-layer configuration without increasing crosstalk.

FIGS. 1A-H and 2A-H illustrate cross-sectional views of interconnects 100 and 200 that include conductors 110 in a DEM configuration, according to certain embodiments. Interconnects 100 in FIGS. 1A-H may be referred to as the triangular DEM configuration and interconnects 200 in FIGS. 2A-H may be referred to as the inverse-triangular DEM configuration.

Reference layer 102 may be a conducting material. Reference layer 102 may be a reference conductor. In some embodiments, the reference layer 102 is a ground reference (e.g., at 0 Volt (V) potential; ground layer). In some embodiments, the reference layer 102 is not a ground reference. For example, the command, address, and control of DDR signals may be referenced to a voltage (e.g., supply voltage (VDDQ)) of 1.2V instead of ground.

An interconnect 100, 200 may be located in a system. The system may include one or more of a circuit board, a printed circuit board (PCB), a multi-die integrated circuit package, a system on a chip (SoC), silicon or other materials on which integrated circuits are fabricated (e.g., gallium arsenide, indium phosphide, silicon germanium, etc.), flexible circuit interconnects, multi-layer dielectric materials in which there is wiring among different components, etc. The reference layer 102 may separate different layers in the system.

An interconnect 100, 200 may couple (e.g., connect) one or more components and/or sockets in a system. An interconnect 100, 200 may be used for PCB interconnects (e.g., board interconnects), interconnects on user equipment PCB (e.g., mobile devices), a data-center server PCB, a semiconductor package where multiple dies are connected together, a semiconductor (e.g., silicon interconnects) where devices are connected together on integrated circuit substrates (e.g., silicon, gallium arsenide, silicon germanium, gallium nitride, indium phosphide, etc.).

In interconnects 100, 200 a first edge surface of conductor 110A is separated from a second edge surface of conductor 110B by the dielectric 104. Corresponding upper surfaces of conductors 110A-B may be disposed in a first plane and corresponding lower surfaces of conductors 110A-B may be disposed in a second plane. In interconnects 100, a lower surface of conductor 110C is separated from the first plane by dielectric 104. In interconnects 200, an upper surface of conductor 110C is separated from the second plane by dielectric 104. The reference layer 102 may be substantially parallel to corresponding upper surfaces and corresponding lower surfaces of the conductors 110A-C. In some embodiments, the edge surfaces of one or more of conductors 110A-C may be substantially perpendicular to the reference layer 102.

Conductor 110C may overlap at least a portion of the dielectric 104 between conductors 110A-B. In some embodiments, conductor 110C may overlap at least one of a portion of conductor 110A or a portion of conductor 110B.

Interconnect 100 may include a solder mask 106. The solder mask 106 may be a protective dielectric coating (e.g., waterproof coating, water resistant coating, coating for electronics used in harsh environments, coating for passivation, protective coating etc.). The solder mask 106 may be disposed on one or more conductors 110 (e.g., upper and side surfaces of conductor 110C in interconnect 100, upper and side surfaces of conductors 110A-B in interconnect 200) disposed on the dielectric 104. The solder mask 106 may be disposed on the dielectric 104 (e.g., upper portions of the dielectric 104 that are not covered by the one or more conductors 110 or other components).

The DEM configuration may allow higher microstrip routing density by doubling the signal-to-ground ratio (e.g., whereas conventional microstrip routing usually allows 1:1 signal to ground ratio). DEM configuration may provide high-density routing which allows minimized semiconductor package, silicon or semiconductor, or PCB real estate.

The DEM configuration may allow the one or more conductors 110 disposed within the dielectric 104 (e.g., embedded microstrip traces on L2) to yield lower-insertion loss provided the dielectric 104 has lower loss tangent or lower dielectric loss than the loss tangent or dielectric loss of solder mask 106. DEM configuration may allow lower insertion loss for the conductors 110 within the dielectric 104 (e.g., differential traces on L2). Routing with lower insertion loss may be used for protocols that use differential routings such as Ethernet, (PCIe®), universal serial bus (USB), serial advanced technology attachment (SATA), etc. Longer routing length may be used for these protocols which may be enabled by the lower insertion loss of the one or more conductors 110 on L2. Layers L1, L2, L3, etc. may be multi-layer PCB designations where L1 is top layer conductor, L2 is a conductor layer under L2, L3 is a conductor layer under L2, etc.

The one or more conductors 110 routed within the dielectric (e.g., traces on L2) may have a greater insertion loss advantage than the one or more conductors 110 routed on the dielectric (e.g., single-ended trace on L1 or top layer). In some embodiments, L1 may be used to route DDR data (DQ) signals. In some embodiments, L1 may be used to route low-speed quasi-static signals such as system management bus (SMBUS), Reset, Power-good (e.g., a power good signal to prevent a system from attempting to operate on improper voltages and to prevent the system from damaging itself by alerting as to improper power supply), etc.

Each conductor has cross-sectional properties of width (w) and thickness (t). The width may be larger than the thickness. Edge-coupled conductors 110A-B may have edges (e.g., of a thickness (t)) that are substantially parallel to each other.

In some embodiments, the conductors 110A-B of an interconnect 100 in a DEM configuration are used for high-speed cases involving conductors carrying signals that change state (e.g., toggle) frequently. For example, the conductors 110A-B of interconnect 100 in a DEM configuration may be used for clocks running in the megahertz (MHz) frequency and higher (e.g., used to carry a corresponding signal that changes state at a corresponding frequency of at least one MHz). In some embodiments, the conductors 110A-B of interconnect 100 in a DEM configuration are used for signals with a corresponding frequency of at least zero MHz or higher (e.g., direct current (DC) signals such as power rails.) In another example, the conductors 110A-B of interconnect 100 in a DEM configuration may be used for data signals that continuously toggle. In another example, the conductors 110A-B of interconnect 100 in a DEM configuration may be used for static data signals with certain transition times (rise and fall times) that do not toggle periodically. In another example, the conductors 110A-B of interconnect 100 in a DEM configuration may be used for data signals for high-speed protocols such as one or more of Ethernet protocol, DDR, PCIe®, serial-attached small computer system interface (SCSI)-serial advanced technology attachment (SAS-SATA), USB, or serial peripheral interface (SPI). The distances between conductor 110C and the conductors 110A-B in the DEM configuration may be symmetrical. In some embodiments, the distances between conductor 110C and the conductors 110A-B in the DEM configuration are not symmetrical.

The tolerance of asymmetry allowed (e.g., difference between x1 and x2, w(A) and w(B), t(A) and t(B), etc.) may depend on factors including speed of the signals the conductors are carrying, lengths of the conductors, amount of discontinuity along the conductors (e.g., vias and connectors). As described herein, substantially equal (e.g., substantially equal dimensions, substantially equal distances, etc.) may include the tolerance of asymmetry. In some embodiments, substantially the same dimensions may be dimensions within 10% of each other. In some embodiments, substantially the same distance may be distances within 10% of each other. Higher speed, longer length, and more discontinuities translate to smaller tolerance allowed (i.e., the smaller the difference in the spacing and the smaller the difference in the physical parameters of the DEM configuration). In some embodiments, the dimensions x1 and x2 may differ by as much as 10% for SATA signals running at 6 gigabits per second (Gbps) for 15 inches (in) (e.g., substantially equal is within 10% of each other), while the maximum difference may be 3% for Ethernet signals running at 25 Gbps for 8 in (e.g., substantially equal is within 3% of each other). The tolerance specifications may be calculated through simulations for specific interconnects 100 in a DEM configuration for specific protocols and specific interconnect topology (e.g., connectors, vias, etc.).

In some embodiments (e.g., low-speed or static cases), the conductors in DEM configuration carry signals that toggle at low frequencies or static signals. For example, a signal toggling at a low frequency may be a signal of an inter-integrated circuit (I2C) running at 100 kilohertz (kHz). In another example, a static signal is a reset and power-good signals having slow transition time (rise/fall time) in the order of microsecond (µs) and millisecond (ms)). For low frequencies or static signals, the conductors 110 may not be symmetrical. If the conductors 110A-B transmit static signals, the parameters may be more arbitrary (e.g., x1, w(A), and t(A) do not have to be substantially equal to x2, w(B), and t(B), respectively). Although these parameters may be arbitrary, simulations may be used to ensure that crosstalk does not prevent the neighboring signals from functioning properly.

Each of conductors 110A-C in the DEM configuration may be in a single-ended configuration or in a differential configuration. For example, conductors 110A-C may be single-ended configuration. In another example, conductor 110C may be in a single-ended configuration and conductors 110A-B may be in a differential configuration. In another example, conductor 110C is in a differential configuration with another conductor disposed on the dielectric 104. Differential configuration refers to propagating a signal through a pair of conductors having at least one reference. The signals on the two conductors may be equal in magnitude and opposite in polarity of the voltage and current flowing through the conductors. A component (e.g., in a differential circuit) may react to the difference between the signals on the two conductors and reject common-mode noise and therefore, is not affected by the common-mode noise. Single-ended configuration refers to propagating a signal via a single conductor having one reference.

As illustrated in FIG. 1A, the conductors (e.g., embedded microstrips) disposed in the dielectric 104 include a pair of conductors (conductor 110A and conductor 110B) that are in an edge-facing orientation (e.g., edge-coupled) within the dielectric 104 above the reference layer 102. Conductor 110A may be interchangeable with conductor 110B. For example, conductors may be interchangeable when the conductors designate differential configuration (e.g., the conductors 110A and 110B carry differential signals). Conductor 110C (e.g., non-embedded microstrip) may be disposed on the dielectric above the pair of conductors 110A-B. In some embodiments, conductor 110C may be disposed on L1 (e.g., the top layer), conductors 110A-B may be disposed on L2, and reference layer 102 may be disposed on L3. In some embodiments, reference layer 102 may be disposed on L10, conductors 110A-B may be disposed on L11, and conductor 110C may be disposed on L12 (e.g., the bottom layer). Layers L1, L2, L3, etc. may be multi-layer PCB designations where L1 is top layer conductor, L2 is a conductor layer under L2, L3 is a conductor layer under L2, etc. In some embodiments, the multi-layer PCB may be a 12-layer PCB. Layers L10, L11, L12, etc. may be multi-layer PCB designations where L12 is bottom layer conductor, L11 is a conductor layer above L12, L10 is a conductor layer above L11, etc.

Conductor 110A may have a width w(A) and a thickness t(A), conductor 110B may have a width w(B) and a thickness t(B), and conductor 110C may have a width w(C) and a thickness t(C). The conductor 110A may be a first distance (x1) from a vertical centerline that intersects the center the conductor 110C. The conductor 110B may be a second distance (x2) from the vertical centerline that intersects the center of the conductor 110C. A bottom surface of the conductor 110C may be a first height (h1) from a horizontal centerline that intersects the center of conductors 100A-B. An upper surface of the reference layer 102 may be a second height (h2) from the horizontal centerline.

In some embodiments, the conductor 110C is a single-ended trace routed on the top layer (e.g., L1). Conductors 110A-B may be differential traces on the layer (e.g., L2) under the top layer according to a triangular scheme. In some embodiments, conductor 110C has an equal distance to conductor 110A and conductor 110B (e.g., single-ended conductor 110C and differential conductors 110A-B may be symmetrical with respect to each other). The distance x1 may be equal to the distance x2. The thickness t(A) may be equal to the thickness t(B), the width w(A) may be equal to the width w(B), and conductors 110A and 100B may have the same composition (e.g., be made from the same one or more materials). The heights h1 and h2 may be different from each other, the dimensions w(C) and t(C) of conductor 110C may be different from the dimensions of conductors 100A-B.

Figure 1B:
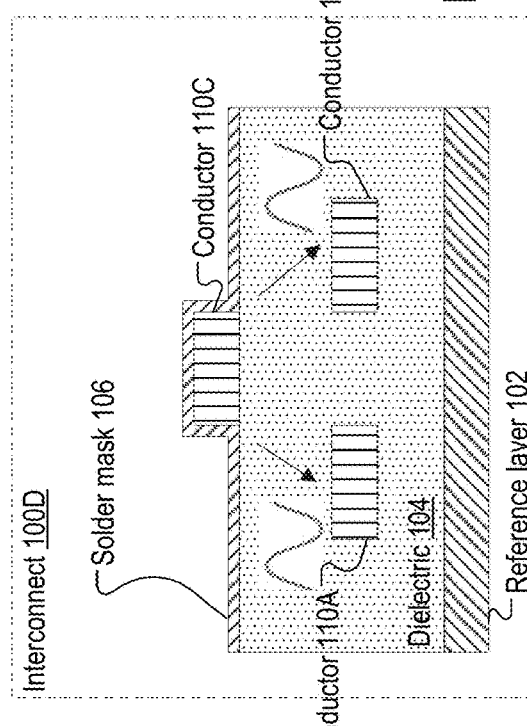

As illustrated in FIG. 1A, conductors 110A-C may have a rectangular cross-section. As illustrated in FIG. 1B, the conductors 110A-C may have a cross-section that is not rectangular. For example, the conductors 110A-C may have a trapezoidal cross-section. The conductors 110A-B may have substantially the same cross-sectional shape. The conductor 110C may have a different cross-sectional shape than conductors 110A-B.

Figure 4A:
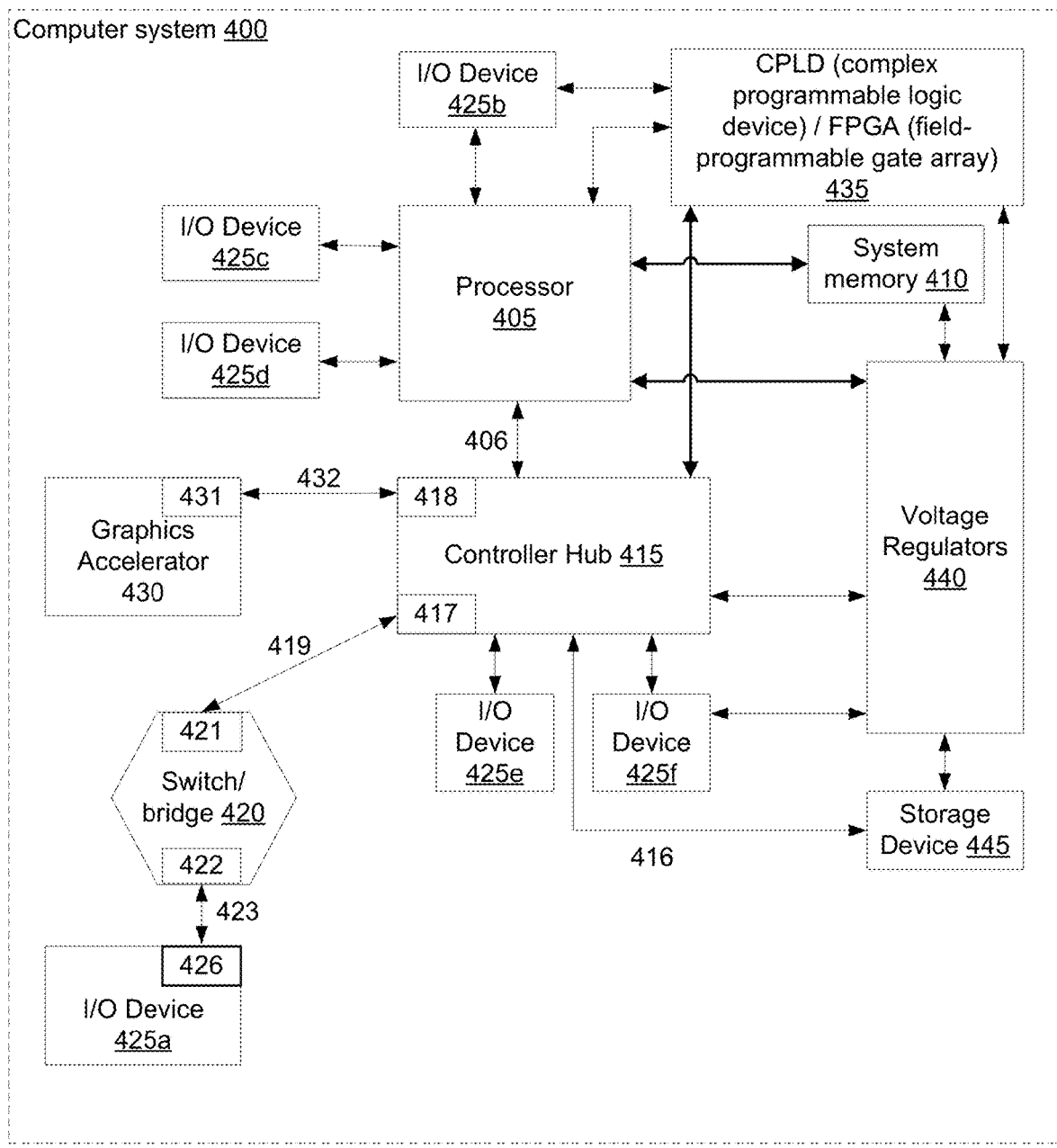
FIG. 4A illustrates a computer system with multiple interconnects, according to certain embodiments.
Figure 4B:
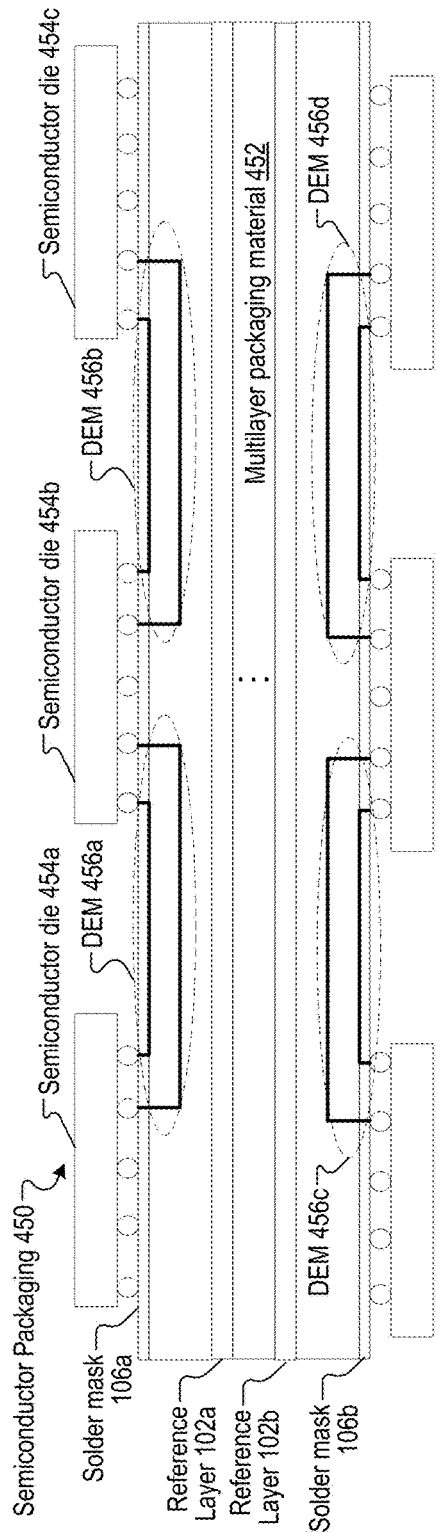
FIG. 4B illustrates semiconductor packaging with multiple interconnects, according to certain embodiments.
Figure 4C:
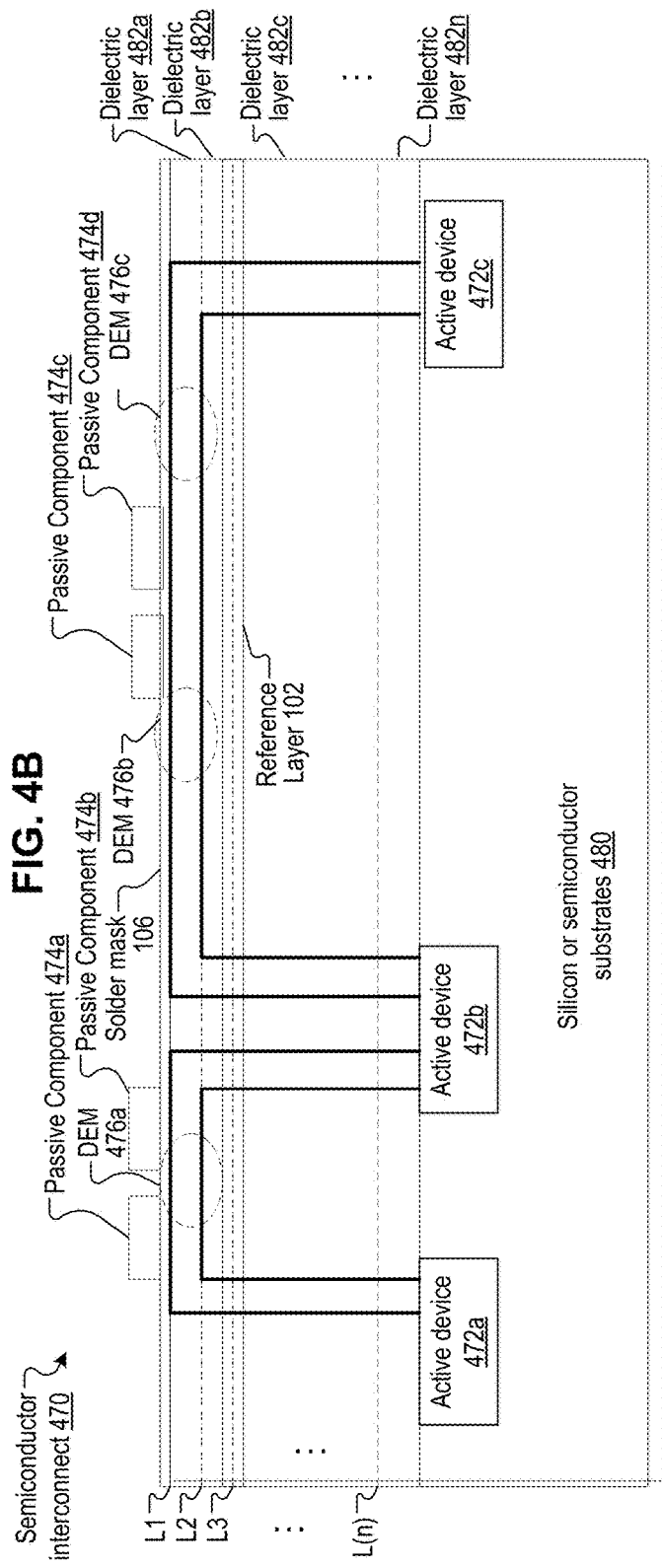
FIG. 4C illustrates a semiconductor interconnect, according to certain embodiments.

Conductors 110A-B in the DEM configuration may be oriented from a surface (e.g., top surface, bottom surface) of a system, down (in the z-direction) to a depth within the dielectric 104, and then oriented within the dielectric until it is oriented up (in the z-direction) to the surface of the system (see FIGS. 4B-C). In some embodiments, the conductors 110A-C in the DEM configuration are routed in a substantially straight line (e.g., parallel to the x-axis or the y-axis). In some embodiments, the conductors 110A-C in the DEM configuration may not be routed in a substantially straight line. For example, the conductors may be routed at different angles, different curves, around components, in a pattern (e.g., zig-zag), etc. The conductors 110A-C in the DEM configuration may substantially maintain the same distances between each other over the course of the routing (e.g., x1=x2 in FIGS. 1A and 2A). In some embodiments, the conductors 110A-C in the DEM configuration may be maintained at substantially the same relative distances and relative dimensions. For example, as x1 increases, x2 may increase at substantially the same rate to maintain substantially the same relative distances.

As illustrated in FIG. 1B, corresponding portions of the conductors 110A-C may overlap. Conductor 110C may overlap conductor 110A by a first distance (d1) and conductor 110C may overlap conductor 110B by a second distance (d2). A thickness of spacing (ts) may be between conductors 110A and 110B. The conductor 110C may overlap the spacing (ts) between conductors 110A and 110B. Conductors 110C may overlap in any of FIGS. 1A-H (e.g., not just in a trapezoidal cross-sections).

Figure 1C:
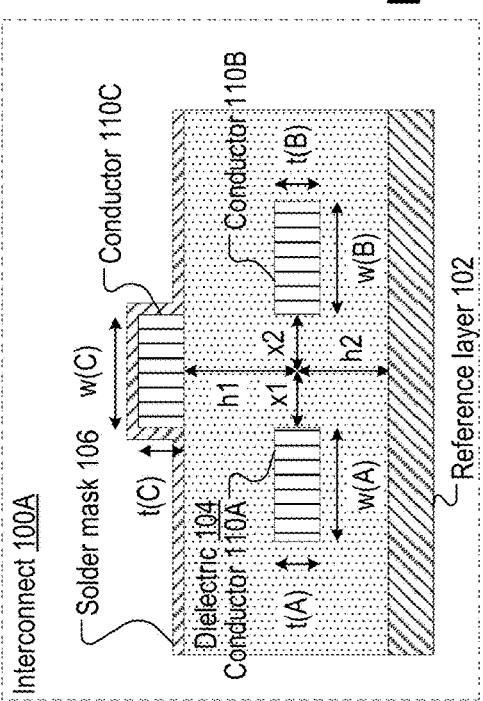
Figure 1D:
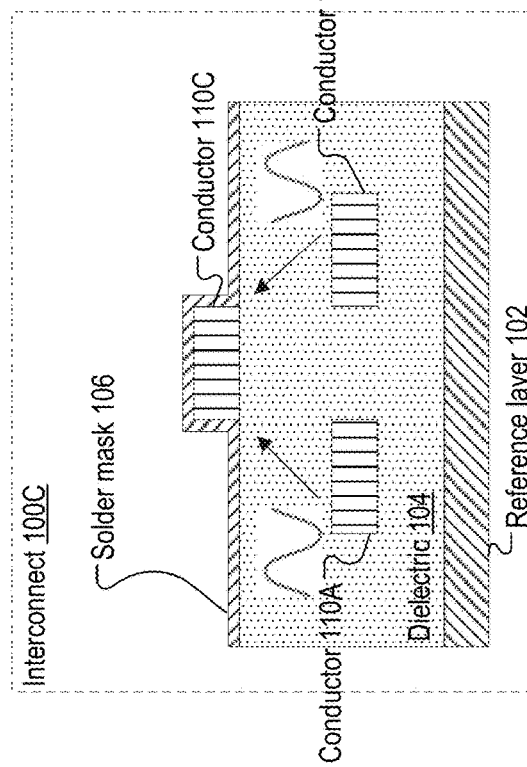

As illustrated in FIGS. 1C-D, the conductors 110 in the DEM configuration may have crosstalk cancellation. Differential system devices may reject common-mode noise. Responsive to conductors 110A-B being differential traces (p and n) routed symmetrically, noise of equal amount having the same polarity injected to conductors 110A-B (p and n) may be rejected by the differential receiver and thus, may not have impact in the electrical performance of the signal. Conductor 110C may be a single-ended (SE) trace placed symmetrically with respect to differential conductors 110A-B (traces p and n). Conductor 110C may receive a first amount of noise from conductor 110A and a second amount of noise from conductor 110B, where the first and second amounts of noise are equal but opposite in polarity and therefore cancel each other out.

As illustrated in FIG. 1C, due to the symmetrical placement of the conductor 110C (e.g., SE trace) and conductors 110A-B (e.g., differential traces), the noise coupled from conductors 110A-B to conductor 110C is equal in magnitude but opposite in polarity and therefore cancels out (e.g., first noise received by conductor 110C from conductor 110A and second noise received by conductor 110C from conductor 110B at least partially cancel out). As illustrated in FIG. 1D, due to the symmetrical placement of the conductor 110C and conductors 110A-B, noise from conductor 110C to conductors 110A-B is equal in magnitude and polarity. Since conductors 110A-B are routed differentially, the differential receiver at the end of conductors 110A-B is to cancel the common-mode noise picked up from conductor 110C (e.g., first noise received by conductor 110A from conductor 110C and second noise received by conductor 110B from conductor 110C at least partially cancel out at a receiving component coupled to conductors 110A-B).

In some embodiments, conductor 110C may not be perfectly centered around conductors 110A-B (e.g., in a PCB process with layer-to-layer misregistration). The asymmetry introduced may break the equal amplitude assumption and therefore the noise may not be perfectly canceled (e.g., see FIGS. 3A-C). The alignment between the conductor 110C and the conductors 110A-B (e.g., SE to differential alignment) may be better controlled (e.g., in package and silicon interconnects) to improve noise cancelation.

In some embodiments, conductor 110C may be a high-speed trace such as a DDR-DQ trace. In some embodiments, conductor 110C may not be a high-speed trace. The conductor 110C may be a quasi-static signal with slow rise/fall time such as Reset and Power-good. In some embodiments, the conductors 110A-B may not be differential signals running at Gigabits per second (Gbps), but may be differential clocks running in the megahertz (MHz) range, such as a PCIe® reference clock. A combination of slow and high-speed signals may be run on L1 and L2. The four routing scenarios for the SE and differential conductors (e.g., conductor 110C and conductors 110A-B) may be: slow-slow (slow SE, slow differential); slow-high (slow SE, high differential); high-slow (high SE, slow differential); and high-high (high SE, high differential). Slow and high may refer to slow and high-speed signals, respectively. Running slow-speed signals via a conductor (e.g., SE or differential-microstrips) routed over conductors transmitting high or slow-speed signals (e.g., on SE or differential-microstrips on another layer) such as low speed on L1 (conductor 110C) and high-speed on L2 (conductors 110A and B) may minimize impact of misregistration. The low-speed signal may not contain high-frequency energy, so the noise coupling mostly happens in the low-frequency regime and therefore may not have significant contribution to FEXT (e.g., far end crosstalk) where noise is injected into one conductor and FEXT is the resulting output noise at the output of adjacent conductor). The lower frequency the noise signal is, the lower the FEXT on high-speed conductors. As for the high-speed to low-speed noise coupling, the high-speed impact on the quasi-static signal may be minimal considering the lower-speed receiver filters out the high-frequency noise.

The DEM configuration can be extrapolated to more than three conductors (e.g., see FIGS. 1E-F). The DEM configuration can be extended or repeated in an isolated or conjoined fashion in which each conductor or pair of conductors can be configured as single-ended or differential configuration. Conductor 110C may be routed in single-ended configuration and conductors 110A-B may be routed in differential configuration.

As illustrated in FIG. 1E, interconnect 100E may include isolated sets of conductors in the DEM configuration, according to certain embodiments. A set of single-ended (conductor 110C) and differential (conductors 110A-B) may be repeated separately as: conductors 110C(1), 110A(1), and 110B(1); conductors 110C(2), 110A(2), and 110B(2); and conductors 110C(n), 110A(n), and 110B(n).

As illustrated in FIG. 1F, interconnect 100F may include conjoined sets of conductors 110 in the DEM configuration. Each of the conductors 110 in interconnect 100F may be used to route single-ended signals. Conductors 110 in a DEM configuration may include: conductors 110A-C; 110C-E, 110E-G, etc.

As illustrated in FIGS. 1G-1H, interconnect 100 may include a dielectric coating 108 (e.g., disposed on the solder mask 106, disposed on dielectric 104 and conductor 110C), according to certain embodiments. As illustrated in FIG. 1G, interconnect 100G may include a dielectric coating 108A that is a conformal coating (e.g., a thin coating). A lower surface of the dielectric coating 108A (conformal coating) may follow the shape of the object that it coats (e.g., includes mesas above conductors 110 on the dielectric 104 and valleys between conductors 110 on the dielectric 104). An upper surface of the dielectric coating 108A may be substantially the same as the lower surface (e.g., also include mesas above conductors 110 on the dielectric 104 and valleys between the conductors 110 on the dielectric). As illustrated in FIG. 1H, interconnect 100H may include a dielectric coating 108B (e.g., additional dielectric) that is a flat coating (e.g., a thicker coating). An upper surface of the dielectric coating 108B may be substantially flat (planar) regardless of the shape of lower surface of the dielectric coating 108B (e.g., regardless of the objects that the dielectric coating 108B coats). An interconnect may include one or more layers of dielectric coating 108.

Figure 2A:
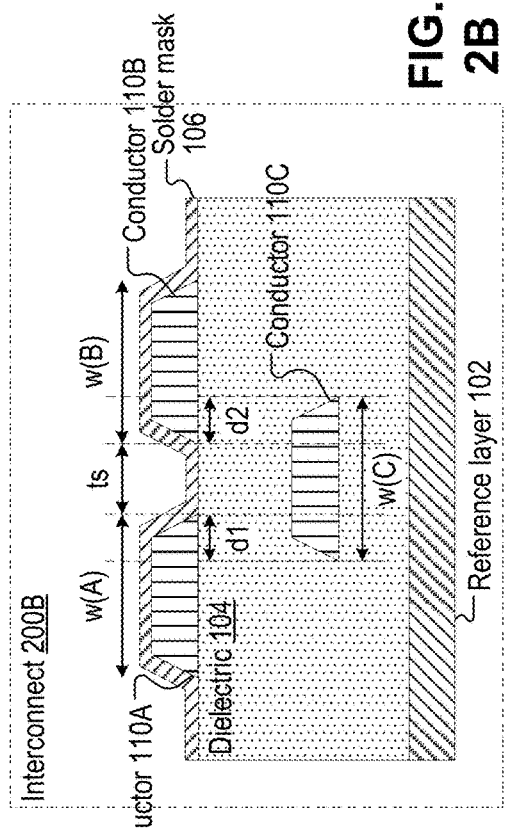

FIGS. 2A-H may illustrate an inverse triangular DEM configuration. FIG. 2A illustrates a cross-sectional view of an interconnect 100A that includes a reference layer 102, a dielectric 104, and conductors 110A-C, according to certain embodiments.

As illustrated in FIG. 2A, the one or more conductors (e.g., embedded microstrips) disposed within the dielectric 104 include conductor 110C. The conductors (e.g., non-embedded microstrips) disposed on the dielectric 104 include a pair of conductors (conductor 110A and conductor 110B) that are in an edge-facing orientation (e.g., edge-coupled). Conductor 110A may be interchangeable with conductor 110B. For example, conductors may be interchangeable when the conductors designate differential configuration (e.g., the conductors 110A and 110B carry differential signals). In some embodiments, conductors 110A-B may be disposed on L1 (e.g., the top layer), conductor 110C may be disposed on L2, and reference layer 102 may be disposed on L3. In some embodiments, reference layer 102 may be disposed on L10, conductor 110C may be disposed on L11, and conductors 110A-B may be disposed on L12 (e.g., the bottom layer) in a 12 layer PCB Conductor 110A may have a width w(A) and a thickness t(A), conductor 110B may have a width w(B) and a thickness t(B), and conductor 110C may have a width w(C) and a thickness t(C). The conductor 110A may be a first distance (x1) from a vertical centerline that intersects the center the conductor 110C. The conductor 110B may be a second distance (x2) from the vertical centerline that intersects the center of the conductor 110C. Bottom surfaces of the conductors 100A-B may be a first height (h1) from a horizontal centerline that intersects the center of conductor 110C. An upper surface of the reference layer 102 may be a second height (h2) from the horizontal centerline.

In some embodiments, conductors 110A-B may be differential traces on the top layer (e.g., L1) and conductor 110C may be a single-ended trace routed on a layer (e.g., L2) under the top layer according to an inverse triangular scheme. In some embodiments, conductor 110C has an equal distance to conductor 110A and conductor 110B (e.g., single-ended conductor 110C and differential conductors 110A-B may be symmetrical with respect to each other). The distance x1 may be equal to the distance x2. The thickness t(A) may be equal to the thickness t(B), the width w(A) may be equal to the width w(B), and conductors 110A and 100B may have the same composition (e.g., be made from the same one or more materials). The heights h1 and h2 may be different from each other, the dimensions w(C) and t(C) of conductor 110C may be different from the dimensions of conductors 100A-B.

Figure 2B:
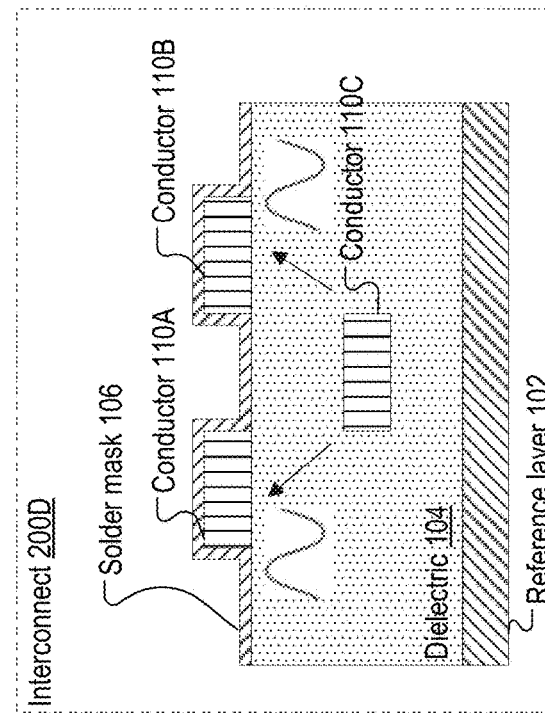

As illustrated in FIG. 2A, conductors 110A-C may have a rectangular cross-section. As illustrated in FIG. 2B, the conductors 110A-C may have a cross-section that is not rectangular. For example, the conductors 110A-C may have a trapezoidal cross-section. The conductors 110A-B may have substantially the same cross-sectional shape. The conductor 110C may have a different cross-sectional shape from conductors 110A-B.

In interconnects 200, conductor 110C in the DEM configuration may be oriented from a surface (e.g., top surface, bottom surface) of a system, down (in the z-direction) to a depth within the dielectric 104, and then oriented within the dielectric until it is oriented up (in the z-direction) to the surface of the system. In some embodiments, the conductors 110A-C in the DEM configuration are routed in a substantially straight line (e.g., parallel to the x-axis or the y-axis). In some embodiments, the conductors 110A-C in the DEM configuration may not be routed in a substantially straight line. For example, the conductors may be routed at different angles, different curves, around components, in a pattern (e.g., zig-zag), etc. The conductors 110A-C in the DEM configuration may substantially maintain the same distances between each other over the course of the routing (e.g., x1=x2 in FIG. 2A). In some embodiments, the conductors 110A-C in the DEM configuration may be maintained at substantially the same relative distances and relative dimensions. For example, as x1 increases, x2 may increase at substantially the same rate to maintain substantially the same relative distances.

As illustrated in FIG. 2B, corresponding portions of the conductors 110A-C may overlap. Conductor 110C may overlap conductor 110A by a first distance (d1) and conductor 110C may overlap conductor 110B by a second distance (d2). A thickness of spacing (ts) may be between conductors 110A and 110B. The spacing (ts) between conductors 110A and 110B may overlap the conductor 110C. Conductors 110A and 110B may overlap in any of FIGS. 2A-H (e.g., not just in a trapezoidal cross-sections).

Figure 2C:
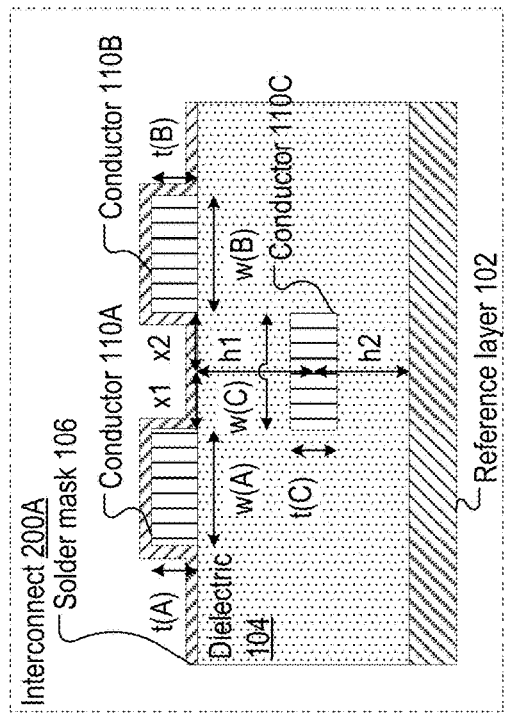
Figure 2D:
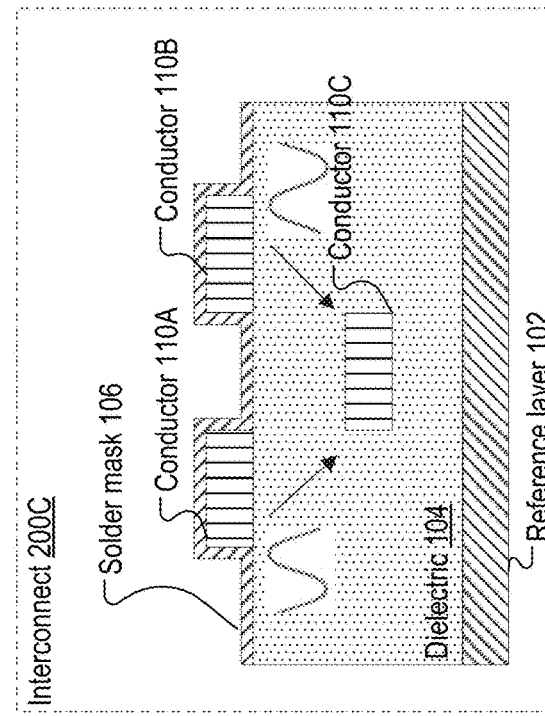

As illustrated in FIGS. 2C-D, the conductors 110 may have crosstalk cancellation. Differential system devices may reject common-mode noise. Responsive to conductors 110A-B being differential traces (p and n) routed symmetrically, noise of equal amount having the same polarity injected to conductors 110A-B (p and n) may be rejected by the differential receiver and thus, may not have impact in the electrical performance of the signal. Conductor 110C may be a single-ended (SE) trace placed symmetrically with respect to differential conductors 110A-B (traces p and n). Conductor 110C may receive a first amount of noise from conductor 110A and a second amount of noise from conductor 110B, where the first and second amounts of noise are equal but opposite in polarity and therefore cancel each other out.

As illustrated in FIG. 2C, due to the symmetrical placement of the conductor 110C (e.g., SE trace) and conductors 110A-B (e.g., differential traces), the noise coupled from conductors 110A-B to conductor 110C is equal in magnitude but opposite in polarity and therefore cancels out (e.g., first noise received by conductor 110C from conductor 110A and second noise received by conductor 110C from conductor 110B at least partially cancel out). As illustrated in FIG. 2D, due to the symmetrical placement of the conductor 110C and conductors 110A-B, noise from conductor 110C to conductors 110A-B is equal in magnitude and polarity. Since conductors 110A-B are routed differentially, the differential receiver at the end of conductors 110A-B is to cancel the common-mode noise picked up from conductor 110C (e.g., first noise received by conductor 110A from conductor 110C and second noise received by conductor 110B from conductor 110C at least partially cancel out at a receiving component coupled to conductors 110A-B).

In some embodiments, conductor 110C may not be perfectly centered around conductors 110A-B (e.g., in a PCB process with layer-to-layer misregistration). The asymmetry introduced may break the equal amplitude assumption and therefore the noise may not be perfectly cancelled. The alignment between the conductor 110C and the conductors 110A-B (e.g., SE to differential alignment) may be better controlled (e.g., in package and silicon interconnects).

In some embodiments, conductor 110C may be a high-speed trace such as a DDR-DQ trace. The conductor 110C may be a quasi-static signal with slow rise/fall time such as Reset and Power-good. In some embodiments, the conductors 110A-B may not be differential signals running at Gigabits per second (Gbps), but may be differential clocks running in the megahertz (MHz) range, such as a PCIe® reference clock. A combination of slow and high-speed signals may be run on L1 (conductors 110A-B) and L2 (conductor 110C), where the reference layer 102 is on L3. The four routing scenarios for the SE and differential conductors (e.g., conductor 110C and conductors 110A-B) may be: slow-slow; slow-high; high-slow; and high-high. Slow and high may refer to slow and high-speed signals, respectively. Running slow-speed signals (e.g., SE or differential-microstrips) over high or slow-speed signals on SE or differential-microstrips on another layer may minimize impact of misregistration. The low-speed signal may not contain high-frequency energy, so the noise coupling mostly happens in the low-frequency regime and therefore may contribute to FEXT on high-speed conductors. As for the high-speed to low-speed noise coupling, the high-speed impact on the quasi-static signal may be minimal considering the lower-speed receiver filters out the high-frequency noise.

The DEM configuration can be extrapolated to more than three conductors (e.g., see FIGS. 2E-F). The DEM configuration can be extended or repeated in an isolated or conjoined fashion in which each conductor or pair of conductors can be configured as single-ended or differential configuration.

As illustrated in FIG. 2E, interconnect 200E may include isolated sets of conductors in the DEM configuration, according to certain embodiments. A set of single-ended (conductor 110C) and differential (conductors 110A-B) may be repeated separately as: conductors 110C(1), 110A(1), and 110B(1); conductors 110C(2), 110A(2), and 110B(2); and conductors 110C(n), 110A(n), and 110B(n).

As illustrated in FIG. 2F, interconnect 100F may include conjoined sets of conductors 110 in the DEM configuration. Each of the conductors 110 in interconnect 200F may be used to route single-ended signals. Conductors 110 in a DEM configuration may include: conductors 110A-C, 110C-E, 110X-Z, etc.

As illustrated in FIGS. 2G-H, interconnect 200 may include dielectric coating 108 (e.g., disposed on the solder mask 106), according to certain embodiments. As illustrated in FIG. 2G, interconnect 200G may include a dielectric coating 108A that is a conformal coating (e.g., a thin coating). A lower surface of the dielectric coating 108A (conformal coating) may follow the shape of the object that it coats (e.g., includes mesas above conductors 110 on the dielectric 104 and valleys between conductors 110 on the dielectric 104). An upper surface of the dielectric coating 108A may be substantially the same as the lower surface (e.g., also include mesas above conductors 110 on the dielectric 104 and valleys between the conductors 110 on the dielectric). As illustrated in FIG. 2H, interconnect 200H may include a dielectric coating 108B (e.g., additional dielectric) that is a flat coating (e.g., a thicker coating). An upper surface of the dielectric coating 108B may be substantially flat (planar) regardless of the shape of lower surface of the dielectric coating 108B (e.g., regardless of the objects that the dielectric coating 108B coats). An interconnect may include one or more layers of dielectric coating 108.

FIGS. 3A-D are graphs 300, 320, 340, and 360 of using an interconnect with conductors routed in the DEM configuration, according to certain embodiments. Graphs 300, 320, 340, and 360 may illustrate one or more of triangular (e.g., FIGS. 1A-H) or inverse-triangular (e.g., FIGS. 2A-H) DEM configuration. The conductors 110A-B (e.g., differential traces) may be designed to have 85-Ohm differential impedance, w(A), t(A), w(B), t(B), h1, h2, x1, x2, and board material such as EM888. For example, trace width (tw) may be 3-10 thousandths of an inch (mils) (e.g., 4 mils) and x (x1 and/or x2) may be about 5 mils. The board material (e.g., of a PCB, of an EM888K board) may have a dielectric constant (DK) of 3.3 and a dielectric loss (DF) of 0.005 at 1 Gigahertz (GHz). The height h1 (e.g., first dielectric thickness) may be 2.7 mils and the height h2 (e.g., second dielectric thickness) may be 3 mils. The conductor 110C may have 50-Ohm impedance and may have trace width (w(C)) and trace thickness (t(C)) that correspond to this impedance. For example, trace width may be 3-10 mils (e.g., 6 mils). The lengths for conductors 110A-C may be 5 inches. The simulations performed may include one or more of: SE (conductor 110C) to diff (conductors 110A-B) FEXT and vice versa in frequency domain; SE (conductor 110C) to diff (conductors 110A-B) FEXT in time domain with fast stimulus (e.g., 80 picoseconds (ps) rise-time) with magnitude of 1 Volt (V); and insertion loss comparison between 85-Ohm differential DEM on L2 having the above dimensions with reference of L3 and standard differential microstrip having the same impedance routed on L1 with ground reference on L2. Since the SE and diff structures are reciprocal, SE-to-diff and diff-to-SE FEXT may be identical.

Figure 3A:
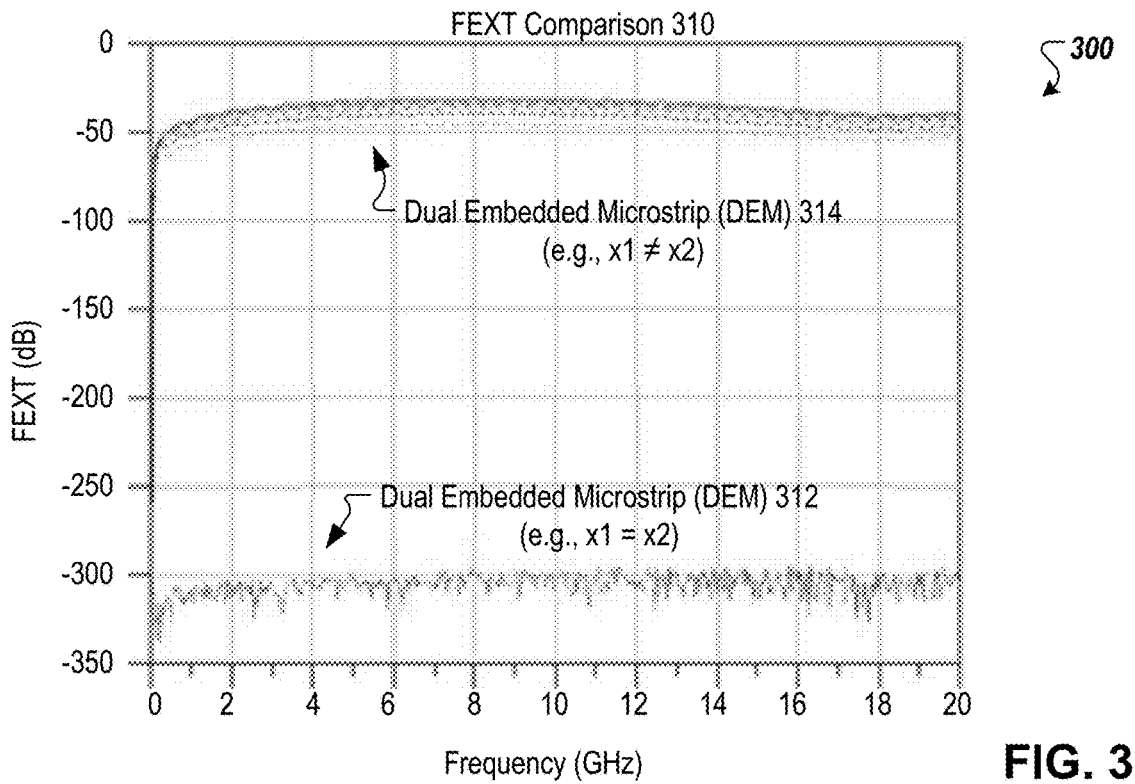
FIG. 3D is a graph that illustrates insertion loss, according to certain embodiments.

FIG. 3A is a graph 300 that illustrates a FEXT comparison 310 in frequency domain for an interconnect in the DEM configuration. Responsive to x1 and x2 being equal (e.g., FIG. 1A, FIG. 2A) in DEM 312, FEXT may be canceled out (e.g., virtually no FEXT when x1=x2). FEXT may increase responsive to an imbalance between x1 and x2 (dx or the difference between x1 and x2) in DEM 314. The distance x1 may be wider than x2 by 0.1 to 0.5 mils or vice versa.

Figure 3B:
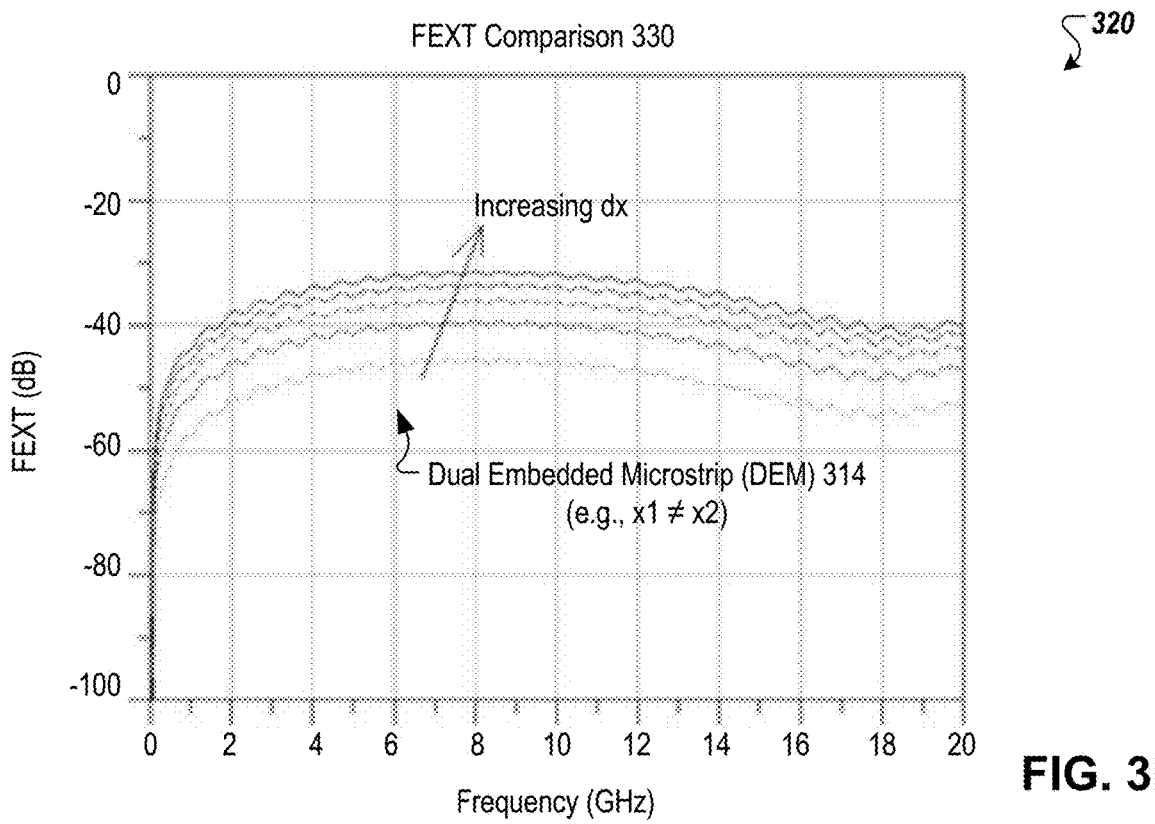

FIG. 3B is a graph 320 that is a zoomed-in version of FIG. 3A and shows the impact of misregistration that causes imbalance in x. The value dx (e.g., dx=absolute value of x1 minus x2) may increase from 0.1 to 0.5 mils in a 0.1 mil increment. The increase in FEXT responsive to an increase in dx of conductors routed in the DEM configuration may be less than the FEXT of conductors not routed in the DEM configuration. Conductors routed in the DEM configuration may allow higher routing density by placing conductors on 2 layers increasing the microstrip routing density (signal to ground ratio) to 2:1 compared to standard microstrip 1:1.

Figure 3C:
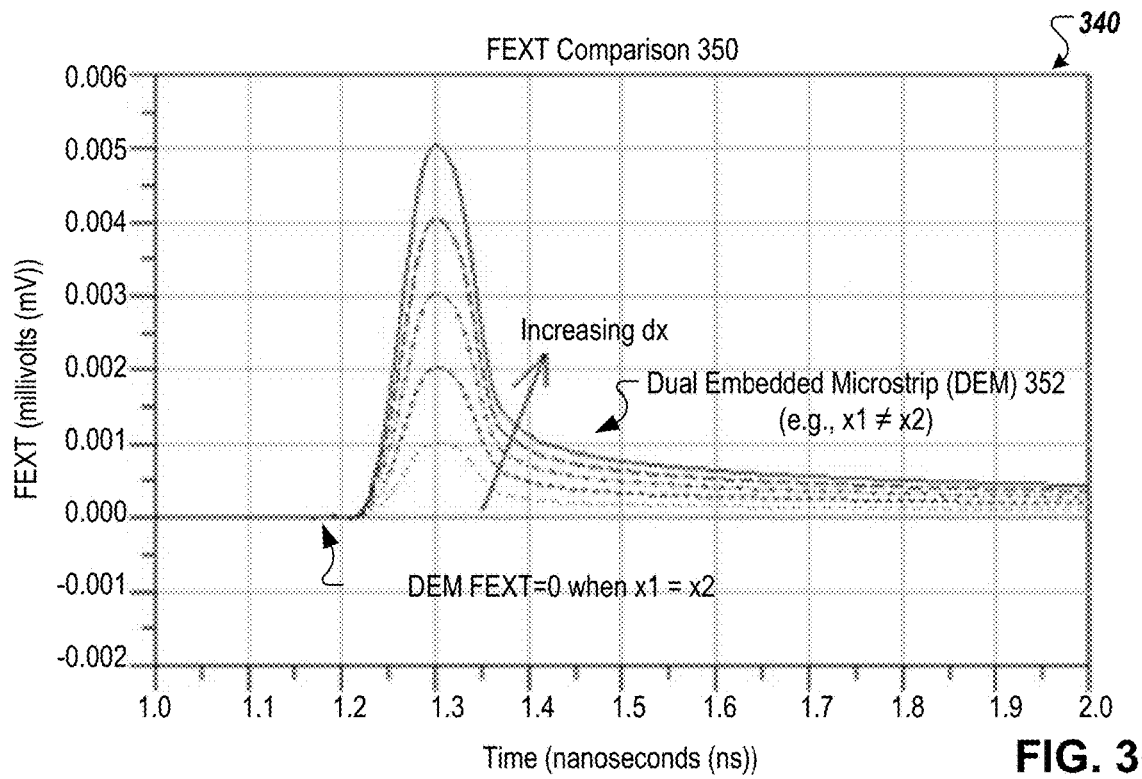

FIG. 3C is a graph 340 of FEXT comparison 350 that illustrates increase of FEXT as a function of dx in a time domain. FEXT may be substantially zero for a dx of substantially zero. Graph 340 may illustrate increasing dx from 0.1 to 0.5 mils with 0.1 mil increments for DEM 352. Graph 340 may illustrate the FEXT increase in time domain as a function for dx. The FEXT may be zero for zero dx. For a 80 ps rise-time aggressor stimulus, which may be a DQ signal running at DDR (e.g., fifth generation DDR (DDR5)) speed at 4GT/s, 0.5 mil dx may give rise to slightly more than 5 millivolts (mV) (or 1%) of FEXT.

Figure 3D:
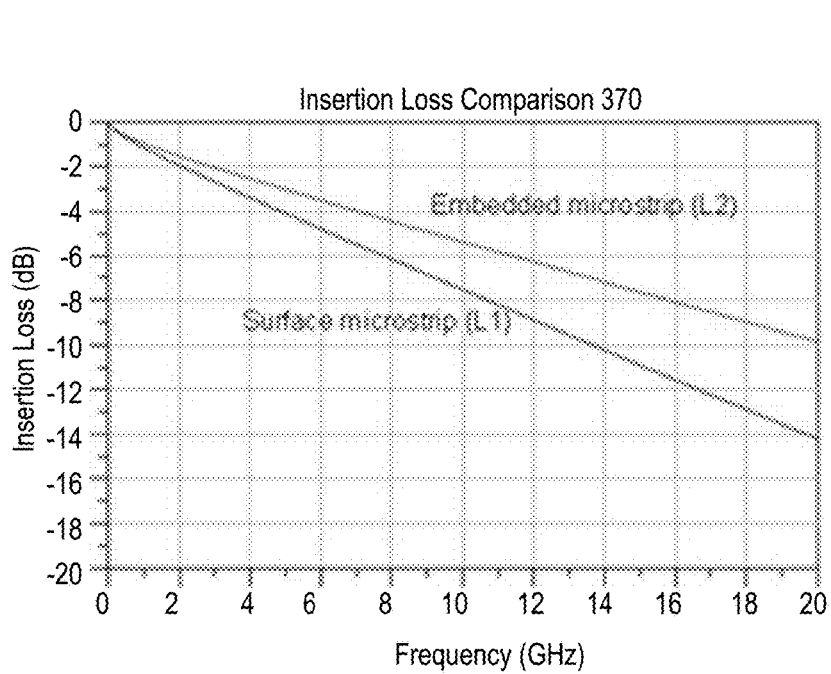

FIG. 3D is a graph 360 that illustrates insertion loss comparison 370 between embedded differential microstrip on L2 (e.g., 110A and B in FIGS. 1A and 1B) having L3 as reference (reference layer 102 in FIGS. 1A and 1B) and standard differential microstrip on L1 with L2 as the ground reference. Both differential pairs may have the same width of 4 mils and length except the trace spacing for the standard differential-pair may be adjusted to 5 mils to have an 85-Ohm impedance. The embedded differential microstrip exhibits nearly 2 dB lower insertion loss at 10 GHz or 0.4 dB/inch at 10 GHz than the standard differential-microstrip. The dataset may validate the insertion loss benefit of conductors routed in the DEM configuration provided the loss tangent of the dielectric material surrounding the L2 differential pair is less than that of the solder mask. The dielectric may be a low-loss material (e.g., EM888K) that has loss tangent of 0.005 at 1 GHz. Insertion loss of a transmission line (e.g., conductor, microstrip) may be proportional (e.g., linear in decibels (dB) as a function of frequency) to the loss-tangent of the dielectric material surrounding the conductor through which the signal propagates.

FIG. 4A illustrates a computer system 400 with multiple interconnects, according to certain embodiments. In some embodiments, system 400 is a printed circuit board (PCB) (e.g., a client motherboard, a server motherboard). Conductors in the DEM configuration (see FIGS. 1A-H and 2A-H) may be used to connect devices in system 400 (e.g., server, mobile, user, or client PCBs). System 400 includes processor 405, system memory 410, controller hub 415, switch/bridge 420, input/output (I/O) devices 425, graphics accelerator 430, complex programmable logic device (CPLD)/field-programmable gate array (FPGA) 435, voltage regulators 440, and storage device 445. Processor 405 includes any processing element, such as a microprocessor, a host processor, an embedded processor, a co-processor, or other processor. Processor 405 is coupled to controller hub 415 through front-side bus (FSB) 406. In one embodiment, FSB 406 is a serial point-to-point interconnect as described below. In another embodiment, FSB 406 (e.g., link) includes a serial, differential interconnect architecture that is compliant with different interconnect standards.

System memory 410 includes any memory device, such as random access memory (RAM), dynamic RAM (DRAM), non-volatile (NV) memory, non-volatile RAM, (NVRAM), or other memory accessible by devices in system 400. Storage device 445 may include a solid state drive (SSD), a hard disk drive (HDD), or other memory accessible by devices in system 400. System memory 410 is coupled to processor 405. Storage device 445 is coupled to controller hub 415 through memory interface 416. In some embodiments, system memory 410 is coupled to controller hub 415 through a memory interface. Examples of a memory interface include a DDR memory interface, a dual-channel DDR memory interface, and a dynamic RAM (DRAM) memory interface.

In one embodiment, controller hub 415 is a root hub, root complex, or root controller. Examples of controller hub 415 include a chipset, a memory controller hub (MCH), a north bridge, an interconnect controller hub (ICH) a south bridge, and a root controller/hub. Often the term chipset refers to two physically separate controller hubs, i.e. a memory controller hub (MCH) coupled to an interconnect controller hub (ICH). Note that current systems often include the MCH integrated with processor 405, while controller hub 415 is to communicate with I/O devices, in a similar manner as described below. In some embodiments, peer-to-peer routing is optionally supported through root complex (e.g., controller hub 415).

Here, controller hub 415 is coupled to switch/bridge 420 through serial link 419. Input/output modules 417 and 421, which may also be referred to as interfaces/ports 417 and 421, include/implement a layered protocol stack to provide communication between controller hub 415 and switch 420. In one embodiment, multiple devices are capable of being coupled to switch 420. In some embodiments, serial link 419 may be coupled directly from interface/port 421 to processor 405. In some embodiments, storage device 445 (SSD) may connect directly to 405. In some embodiments, switch 421 may connect to 425 I/O device and storage device 445.

Switch/bridge 420 routes packets/messages from I/O device 425 upstream, i.e. up a hierarchy towards a root complex, to controller hub 415 and downstream, i.e. down a hierarchy away from a root controller, from processor 405 or system memory 410 to device 425. Switch 420, in one embodiment, is referred to as a logical assembly of multiple virtual PCI-to-PCI bridge devices. Device 425 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Fire wire device, a USB device, a scanner, and other input/output devices. Often in the PCIe® vernacular, such as device, is referred to as an endpoint. Although not specifically shown, device 425 may include a PCIe® to PCI/PCI-X bridge to support legacy or other version PCI devices. Endpoint devices in PCIe® are often classified as legacy, PCIe®, or root complex integrated endpoints. In some embodiments, interface/port 421 may include PCIe® switch. In some embodiments, interface/port 426 may include PCIe® SSD (e.g., non-volatile memory (NVM) express (NVMe)).

Graphics accelerator 430 is also coupled to controller hub 415 through serial link 432. In one embodiment, graphics accelerator 430 is coupled to an MCH, which is coupled to an ICH. Switch 420, and accordingly I/O device 425, is then coupled to the ICH. I/O modules 431 and 418 are also to implement a layered protocol stack to communicate between graphics accelerator 430 and controller hub 415. Similar to the MCH discussion above, a graphics controller or the graphics accelerator 430 itself may be integrated in processor 405.

I/O device 425 includes an interface 426 and switch/bridge 420 includes an interface 422. Interface 426 is coupled to interface 422 via serial link 423.

In one embodiment, short range wireless engines including a WLAN unit and a Bluetooth® unit may couple to processor 405 via an interconnect (e.g., according to a serial data input/output (SDIO) standard). Of course, the actual physical connection between these peripheral devices, which may be configured on one or more add-in cards, can be by way of the NGFF connectors adapted to a motherboard. Using WLAN unit, Wi-Fi® communications in accordance with a given Institute of Electrical and Electronics Engineers (IEEE) 802.11 standard can be realized, while via a unit using the Bluetooth® technology, short range communications via a Bluetooth® protocol can occur. In another embodiment, these units may communicate with processor 405 via, e.g., a USB link or a universal asynchronous receiver transmitter (UART) link.

The processor 405 may be coupled to one or more of I/O devices 425, controller hub 415, switch/bridge 420, CPLD/FPGA 435, system memory 410, etc. via conductors in a DEM configuration.

Controller hub 415 and/or switch/bridge 420 may be coupled to one or more corresponding I/O devices 425 via conductors in a DEM configuration.

CPLD/FPGA 435 may be coupled to one or more of I/O device 425, controller hub 415, switch/bridge 420, or voltage regulators 440 via conductors in a DEM configuration.

Voltage regulators 440 may be coupled (e.g., via conductors in the DEM configuration) to one or more of I/O device 425, processor 405, system memory 410, switch/bridge 420, controller hub 415, storage device 445, or CPLD/FPGA 435.

One or more of the components of system 400 may be coupled (e.g., connected) by a DEM interconnect (e.g., DEM conductor system) as described herein. For example, one or more of FSB 406, memory interface 416, serial link 419, serial link 423, or serial link 432 may be implemented by conductors routed in a DEM configuration.

In some embodiments, first, second, and third conductors are in a DEM configuration. A first component may be coupled to a second component via the first conductor and the second conductor in the DEM configuration. A third component and fourth component may be coupled via the third conductor in the DEM configuration.

In some embodiments, first, second, and third conductors are in a DEM configuration and the first, second, and third conductors are coupled between a first component and a second component.

In some embodiments, first, second, and third conductors are in a DEM configuration. A first component may be coupled to a second component via the first conductor, the first component may be coupled to a third component via a second conductor, and the first component may be coupled to a fourth component via the third conductor.

FIG. 4B illustrates semiconductor packaging 450 with multiple interconnects, according to certain embodiments. In some embodiments, semiconductor packaging 450 is a PCB. In some embodiments, semiconductor packaging 450 is a multi-die semiconductor. In some embodiments, semiconductor packaging 450 is an integrated circuit packaging. Conductors in the DEM configuration may be used to connect devices in semiconductor packaging 450. Semiconductor packaging 450 includes semiconductor dies 454 disposed on multilayer packaging material 452 (e.g., dielectric 104). Semiconductor dies 454 may include one or more of a microprocessor, radio frequency integrated circuit, power management integrated circuit, memory devices, analog-mixed signal integrated circuit, or passive devices (e.g., filter antenna, capacitor, resistor, inductor, etc.). Conductors in the DEM configuration (DEM 456) may include conductors 110A-C. Conductors 110A-B may be routed from a first semiconductor die 454 vertically into the multilayer packaging material 452, then horizontally in the multilayer packaging material 452, and then vertically to a second semiconductor die 454. Conductor 110C may be routed from a first semiconductor die 454 vertically onto the multilayer packaging material 452 (under the solder mask 106), then horizontally on the multilayer packaging material 452, and then vertically to a second semiconductor die 454. In some embodiments, the conductors 110 (e.g., conductor 110C in triangular DEM configuration, conductors 110A-B in inverse triangular configuration) disposed on the dielectric 104 (multiplayer packaging material 452) may not be routed vertically (e.g., no vertical connection used when connecting conductors 110 on the surface layer to semiconductor die 454). Multiple sets of conductors in the DEM configuration (DEM 456) may be routed from a first semiconductor die 454 to a second semiconductor die 454. In some embodiments, solder mask 106a is disposed on one or more of the upper surface or the lower surface of the semiconductor packaging 450. In some embodiments, solder mask 106a may not be disposed on one or more of the upper surface or the lower surface of the semiconductor packaging 450. In some embodiments, passivation or protective coating is disposed on one or more of the upper surface or the lower surface of the semiconductor packaging 450.

FIG. 4C illustrates a semiconductor interconnect, according to certain embodiments. In some embodiments, semiconductor interconnect 470 is an integrated circuit (die) interconnect. In some embodiments, semiconductor interconnect 470 includes a silicon or semiconductor substrate 480. Active devices 472 (e.g., transistor, diode, etc.) may be disposed on or in the silicon or semiconductor substrates 480. Dielectric layers 482 (e.g., dielectric 104) may be disposed on the silicon semiconductor substrates 480. For example, a dielectric layer 482n may be disposed on the silicon or semiconductor substrate 480. Dielectric layers 482a-b may be disposed on reference layer 102 (L3). Each DEM configuration 476 may include conductor 110C (L1) on dielectric layer 482a and conductors 110A-B (L2) between dielectric layers 482a and 482b (or conductor 110C on L2 and conductors 110A-B on L1). Dielectric layer 482b may be disposed on reference layer 102 (L3). One or more reference layers and dielectric layers 482 may be disposed between reference layer 102 (L3) and the silicon or semiconductor substrates 480. A passive component (e.g., resistor, capacitor, inductor, etc.) may be disposed on the uppermost metal layer. DEM (e.g., DEM 476a) may be routed vertically from the active device 472a to the uppermost metal layers 478 to establish connection to the uppermost metal layers, other active devices 472b-c, or passive components 474a-d. Each active device 472 may be coupled to multiple passive components 474 via different sets of conductors routed in the DEM configuration (DEM 476). DEM can also be used to connect passive components to passive components (e.g., DEM does not need to be strictly from or to active devices). In some embodiments, DEM may be implemented on the first 3 metal layers from the top and from the bottom (e.g., L1, L2, and L3 or L10, L11, and L12). In some embodiments, solder mask 106 is disposed on the upper surface of the semiconductor interconnect 470. In some embodiments, solder mask 106 may not be disposed on the upper surface of the semiconductor interconnect 470. In some embodiments, passivation or protective coating is disposed on the upper surface of the semiconductor interconnect 470.

Figure 5:
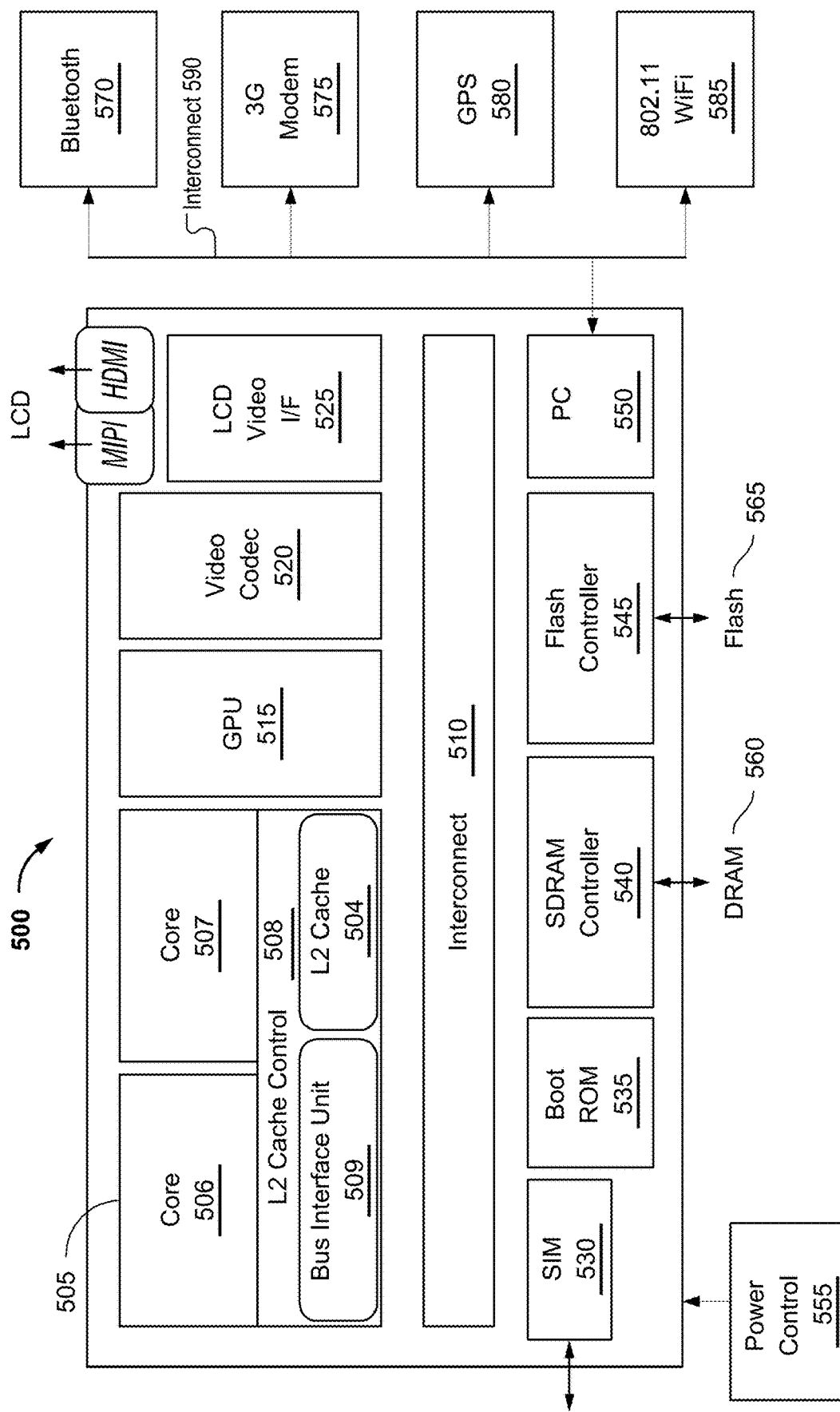
FIG. 5 illustrates a system on a chip (SOC) design, according to certain embodiments.

Turning next to FIG. 5, an embodiment of a system 500 including a system on-chip (SOC) 505 design, according to certain embodiments. As a specific illustrative example, system 500 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 505 includes 2 cores-506 and 507. Similar to the discussion above, cores 506 and 507 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 506 and 507 are coupled to cache control 508 that is associated with bus interface unit 509 and L2 cache 504 to communicate with other parts of system 500. Interconnect 510 includes an on-chip interconnect, such as an IOSF, AMBA, or other interconnect discussed above, which potentially implements one or more aspects of the described disclosure. Interconnect 510 may connect all devices or components in SOC 505 to each other (e.g., core 506 to GPU 515, video codec 520 to LCO video I/F 525, etc.).

Interconnect 510 (e.g., interface) provides communication channels to the other components, such as a Subscriber Identity Module (SIM) 530 to interface with a SIM card, a boot rom 535 to hold boot code for execution by cores 506 and 507 to initialize and boot system 500 or SOC 505, a SDRAM controller 540 to interface with external memory (e.g. DRAM 560), a flash controller 545 to interface with non-volatile memory (e.g. Flash 565), a peripheral control 550 (e.g. Serial Peripheral Interface) to interface with peripherals, video codecs 520 and Video interface 525 to display and receive input (e.g. touch enabled input), GPU 515 to perform graphics related computations, etc. Any of these interfaces may incorporate aspects of the disclosure described herein.

In some embodiments, interconnect 510 may be interconnect 100 of one or more of FIGS. 1A-H or interconnect 200 of one or more of FIGS. 2A-H. Interconnect 510 may include conductors in a DEM configuration to couple one or more components of system 500 or SOC 505.

In addition, the system illustrates peripherals for communication, such as a Bluetooth® module 570, 3G modem 575, GPS 585, and Wi-Fi® 585. Note as stated above, a UE includes a radio for communication. As a result, these peripheral communication modules are not all required. However, in a UE some form a radio for external communication is to be included. Conductors in a DEM configuration may be implemented in interconnect 510 and may be implemented from 505 to other devices (e.g., 570, 575, 580, 585) (e.g., via interconnect 590).

The following examples pertain to further embodiments.

Example 1 is an interconnect comprising: a reference layer; a dielectric disposed on the reference layer; a pair of conductors comprising a first conductor and a second conductor that are in an edge-facing orientation within the dielectric; and a third conductor disposed on the dielectric above the first conductor and the second conductor, wherein first noise received by the third conductor from the first conductor and second noise received by the third conductor from the second conductor at least partially cancel out.

In Example 2, the subject matter of Example 1, wherein the first conductor is a first embedded microstrip, the second conductor is a second embedded microstrip, and the third conductor is a non-embedded microstrip.

In Example 3, the subject matter of any one of Examples 1-2, wherein a protective dielectric coating is disposed on the dielectric and on an upper surface of the third conductor.

In Example 4, the subject matter of any one of Examples 1-3, wherein an additional dielectric coating is disposed on the protective dielectric coating.

In Example 5, the subject matter of any one of Examples 1-4, wherein the third conductor is single-ended, and wherein the first conductor and the second conductor are differential.

In Example 6, the subject matter of any one of Examples 1-5, wherein the first conductor, the second conductor, and the third conductor are single-ended.

In Example 7, the subject matter of any one of Examples 1-6, wherein the third conductor is substantially equidistant from the first conductor and the second conductor, and wherein the first conductor and the second conductor have substantially same dimensions.

In Example 8, the subject matter of any one of Examples 1-7, wherein each of the first conductor and the second conductor is to carry a corresponding signal that changes state at a corresponding frequency of at least one megahertz (MHz).

Example 9 is a system comprising: a first component; a second component; and a conductor system coupled between the first component and the second component, wherein the conductor system comprises: a reference layer; a dielectric disposed on the reference layer; a pair of conductors comprising a first conductor and a second conductor that are edge-coupled within the dielectric; and a third conductor disposed on the dielectric above the first conductor and the second conductor, wherein first noise received by the first conductor from the third conductor and second noise received by the second conductor from the third conductor at least partially cancel out at one or more of the first component or the second component.

In Example 10, the subject matter of Example 9, wherein the first conductor is a first embedded microstrip, the second conductor is a second embedded microstrip, and the third conductor is a non-embedded microstrip.

In Example 11, the subject matter of any one of Examples 9-10, wherein a protective dielectric coating is disposed on the dielectric and on an upper surface of the third conductor.

In Example 12, the subject matter of any one of Examples 9-11, wherein an additional dielectric coating is disposed on the protective dielectric coating.

In Example 13, the subject matter of any one of Examples 9-12, wherein the third conductor is single-ended, and wherein the first conductor and the second conductor are differential, wherein the third conductor is substantially equidistant from the first conductor and the second conductor, and wherein the first conductor and the second conductor have substantially same dimensions.

In Example 14, the subject matter of any one of Examples 9-13, wherein the first conductor, the second conductor, and the third conductor are single-ended.

In Example 15, the subject matter of any one of Examples 9-14, wherein the first component is coupled to the second component via the first conductor and the second conductor, wherein the system further comprises a third component and a fourth component, wherein the third component is coupled to the fourth component via the third conductor.

Example 16 is a circuit board comprising: a first socket; a second socket; and an interconnect connecting the first socket and the second socket, the interconnect comprising: a reference layer; a dielectric disposed on the reference layer; a pair of conductors comprising a first conductor and a second conductor that are edge-coupled and disposed within the dielectric; and a third conductor disposed on the dielectric below the first conductor and the second conductor, wherein first noise received by the third conductor from the first conductor and second noise received by the third conductor from the second conductor at least partially cancel out.

In Example 17, the subject matter of Example 16, wherein the first conductor is a first embedded microstrip, the second conductor is a second embedded microstrip, and the third conductor is a non-embedded microstrip.

In Example 18, the subject matter of any one of Examples 16-17, wherein a protective dielectric coating is disposed on the dielectric and on an upper surface of the third conductor.

In Example 19, the subject matter of any one of Examples 16-18, wherein the third conductor is single-ended, and wherein the first conductor and the second conductor are differential, wherein the third conductor is substantially equidistant from the first conductor and the second conductor, and wherein the first conductor and the second conductor have substantially same dimensions.

In Example 20, the subject matter of any one of Examples 16-19, wherein the first conductor, the second conductor, and the third conductor are single-ended.

Example 21 is an interconnect comprising: a reference layer; a dielectric disposed on the reference layer; a pair of conductors comprising a first conductor and a second conductor that are in an edge-facing orientation disposed on the dielectric; and a third conductor within the dielectric below the first conductor and the second conductor, wherein first noise received by the third conductor from the first conductor and second noise received by the third conductor from the second conductor at least partially cancel out.

In Example 22, the subject matter of Example 21, wherein the first conductor is a first non-embedded microstrip, the second conductor is a second non-embedded microstrip, and the third conductor is an embedded microstrip.

In Example 23, the subject matter of any one of Examples 21-22, wherein a protective dielectric coating is disposed on the dielectric, a first upper surface of the first conductor, and a second upper surface of the second conductor.

In Example 24, the subject matter of any one of Examples 21-23, wherein an additional dielectric coating is disposed on the protective dielectric coating.

In Example 25, the subject matter of any one of Examples 21-24, wherein the third conductor is single-ended, and wherein the first conductor and the second conductor are differential.

In Example 26, the subject matter of any one of Examples 21-25, wherein the first conductor, the second conductor, and the third conductor are single-ended.

In Example 27, the subject matter of any one of Examples 21-26, wherein the third conductor is substantially equidistant from the first conductor and the second conductor, and wherein the first conductor and the second conductor have substantially same dimensions.

In Example 28, the subject matter of any one of Examples 21-27, wherein each of the first conductor and the second conductor is to carry a corresponding signal that changes state at a corresponding frequency of at least one megahertz (MHz).

Example 29 is a system comprising: a first component; a second component; and a conductor system coupled between the first component and the second component, wherein the conductor system comprises: a reference layer; a dielectric disposed on the reference layer; a pair of conductors comprising a first conductor and a second conductor that are edge-coupled and disposed on the dielectric; and a third conductor within the dielectric below the first conductor and the second conductor, wherein first noise received by the first conductor from the third conductor and second noise received by the second conductor from the third conductor at least partially cancel out at one or more of the first component or the second component.

In Example 30, the subject matter of Example 29, wherein the first conductor is a first non-embedded microstrip, the second conductor is a second non-embedded microstrip, and the third conductor is an embedded microstrip.

In Example 31, the subject matter of any one of Examples 29-30, wherein a protective dielectric coating is disposed on the dielectric, a first upper surface of the first conductor, and a second upper surface of the second conductor.

In Example 32, the subject matter of any one of Examples 29-31, wherein an additional dielectric coating is disposed on the protective dielectric coating.

In Example 33, the subject matter of any one of Examples 29-32, wherein the third conductor is single-ended, and wherein the first conductor and the second conductor are differential, wherein the third conductor is substantially equidistant from the first conductor and the second conductor, and wherein the first conductor and the second conductor have substantially same dimensions.

In Example 34, the subject matter of any one of Examples 29-33, wherein the first conductor, the second conductor, and the third conductor are single-ended.

In Example 35, the subject matter of any one of Examples 29-34, wherein the first component is coupled to the second component via the first conductor and the second conductor, wherein the system further comprises a third component and a fourth component, wherein the third component is coupled to the fourth component via the third conductor.

Example 36 is a circuit board comprising: a first socket; a second socket; and an interconnect connecting the first socket and the second socket, the interconnect comprising: a reference layer; a dielectric disposed on the reference layer; a pair of conductors comprising a first conductor and a second conductor that are edge-coupled and disposed on the dielectric; and a third conductor disposed within the dielectric below the first conductor and the second conductor, wherein first noise received by the third conductor from the first conductor and second noise received by the third conductor from the second conductor at least partially cancel out.

In Example 37, the subject matter of Example 36, wherein the first conductor is a first non-embedded microstrip, the second conductor is a second non-embedded microstrip, and the third conductor is an embedded microstrip.

In Example 38, the subject matter of any one of Examples 36-37, wherein a protective dielectric coating is disposed on the dielectric, a first upper surface of the first conductor, and a second upper surface of the second conductor.

In Example 39, the subject matter of any one of Examples 36-38, wherein the third conductor is single-ended, and wherein the first conductor and the second conductor are differential, wherein the third conductor is substantially equidistant from the first conductor and the second conductor, and wherein the first conductor and the second conductor have substantially same dimensions.

In Example 40, the subject matter of any one of Examples 36-39, wherein the first conductor, the second conductor, and the third conductor are single-ended.

Various embodiments can have different combinations of the structural features described above. For instance, all optional features of the computing system described above can also be implemented with respect to the method or process described herein and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler embodiments, specific expression of algorithms in code, specific power down and gating techniques/logic and other specific operational details of computer system have not been described in detail in order to avoid unnecessarily obscuring the present disclosure.

The embodiments may be described with reference to components in high speed I/O (HSIO) devices in specific integrated circuits, such as in computing platforms or microprocessors. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications as well as data-center server platforms. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible embodiments of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) can refer to the combination of the microcontroller and the non-transitory medium. Often module boundaries that are illustrated as separate commonly vary and potentially overlap. For example, a first and a second module can share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' capable 'of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "carrying," "coupling," "transmitting," "receiving," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:
1. An interconnect comprising: a reference layer;
a dielectric disposed on the reference layer;
a pair of conductors comprising a first conductor and a second conductor that are in an edge-facing orientation within the dielectric; and
a third conductor disposed on the dielectric above the first conductor and the second conductor, wherein first noise received by the third conductor from the first conductor and second noise received by the third conductor from the second conductor at least partially cancel out.

2. The interconnect of claim 1, wherein the first conductor is a first embedded microstrip, the second conductor is a second embedded microstrip, and the third conductor is a non-embedded microstrip.

3. The interconnect of claim 1, wherein a protective dielectric coating is disposed on the dielectric and on an upper surface of the third conductor.

4. The interconnect of claim 3, wherein an additional dielectric coating is disposed on the protective dielectric coating.

5. The interconnect of claim 1, wherein the third conductor is single-ended, and wherein the first conductor and the second conductor are differential.

6. The interconnect of claim 1, wherein the first conductor, the second conductor, and the third conductor are single-ended.

7. The interconnect of claim 1, wherein the third conductor is substantially equidistant from the first conductor and the second conductor, and wherein the first conductor and the second conductor have substantially same dimensions.

8. The interconnect of claim 1, wherein each of the first conductor and the second conductor is to carry a corresponding signal that changes state at a corresponding frequency of at least one megahertz (MHz).

9. A system comprising: a first component;
a second component; and
a conductor system coupled between the first component and the second component, wherein the conductor system comprises:
a reference layer;
a dielectric disposed on the reference layer;
a pair of conductors comprising a first conductor and a second conductor that are edge-coupled within the dielectric; and
a third conductor disposed on the dielectric above the first conductor and the second conductor, wherein first noise received by the first conductor from the third conductor and second noise received by the second conductor from the third conductor at least partially cancel out at one or more of the first component or the second component.

10. The system of claim 9, wherein the first conductor is a first embedded microstrip, the second conductor is a second embedded microstrip, and the third conductor is a non-embedded microstrip.

11. The system of claim 9, wherein a protective dielectric coating is disposed on the dielectric and on an upper surface of the third conductor.

12. The system of claim 11, wherein an additional dielectric coating is disposed on the protective dielectric coating.

13. The system of claim 9, wherein the third conductor is single-ended, and wherein the first conductor and the second conductor are differential, wherein the third conductor is substantially equidistant from the first conductor and the second conductor, and wherein the first conductor and the second conductor have substantially same dimensions.

14. The system of claim 9, wherein the first conductor, the second conductor, and the third conductor are single-ended.

15. The system of claim 9, wherein the first component is coupled to the second component via the first conductor and the second conductor, wherein the system further comprises a third component and a fourth component, wherein the third component is coupled to the fourth component via the third conductor.

16. A circuit board comprising: a first socket;
a second socket; and
an interconnect connecting the first socket and the second socket, the interconnect comprising:
a reference layer;
a dielectric disposed on the reference layer;
a pair of conductors comprising a first conductor and a second conductor that are edge-coupled and disposed on the dielectric; and
a third conductor disposed within the dielectric below the first conductor and the second conductor, wherein first noise received by the third conductor from the first conductor and second noise received by the third conductor from the second conductor at least partially cancel out.

17. The circuit board of claim 16, wherein the first conductor is a first non-embedded microstrip, the second conductor is a second non-embedded microstrip, and the third conductor is an embedded microstrip.

18. The circuit board of claim 16, wherein a protective dielectric coating is disposed on the dielectric, a first upper surface of the first conductor, and a second upper surface of the second conductor.

19. The circuit board of claim 16, wherein the third conductor is single-ended, and wherein the first conductor and the second conductor are differential, wherein the third conductor is substantially equidistant from the first conductor and the second conductor, and wherein the first conductor and the second conductor have substantially same dimensions.

20. The circuit board of claim 16, wherein the first conductor, the second conductor, and the third conductor are single-ended.

* * * * *